United States Patent [19]

Hirano et al.

[11] Patent Number: 5,698,070
[45] Date of Patent: Dec. 16, 1997

[54] METHOD OF ETCHING FILM FORMED ON SEMICONDUCTOR WAFER

[75] Inventors: Yoshihisa Hirano; Yoshifumi Tahara; Hiroshi Nishikawa; Isahiro Hasegawa; Keiji Horioka, all of Tokyo, Japan

[73] Assignee: Tokyo Electron Limited, Tokyo, Japan

[21] Appl. No.: 175,513

[22] Filed: Dec. 30, 1993

Related U.S. Application Data

[63] Continuation-in-part of Ser. No. 145,179, Nov. 3, 1993, abandoned, which is a continuation of Ser. No. 988,669, Dec. 10, 1992, Pat. No. 5,270,266.

[30] Foreign Application Priority Data

Dec. 13, 1991 [JP] Japan ...................... 3-352073

[51] Int. Cl.$^6$ .......................................... H05H 1/00
[52] U.S. Cl. ........................ 156/643.1; 156/646.1; 156/345
[58] Field of Search ................ 437/228; 156/643.1, 156/646.1; 118/725, 715, 732, 728

[56] References Cited

U.S. PATENT DOCUMENTS

| | | | |
|---|---|---|---|
| 4,565,601 | 1/1986 | Kakehi et al. ............... | 156/345 X |
| 4,661,228 | 4/1987 | Mintz ........................... | 204/298.18 |
| 4,680,061 | 7/1987 | Lamont, Jr. .................. | 250/398 |
| 4,909,314 | 3/1990 | Lamont, Jr. .................. | 204/298.09 |
| 4,931,135 | 6/1990 | Horiuchi et al. ............. | 156/345 X |
| 5,024,747 | 6/1991 | Turner et al. ................ | 118/725 |
| 5,147,493 | 9/1992 | Nishimura et al. ........... | 156/345 |
| 5,147,497 | 9/1992 | Nozawa et al. ............... | 156/345 X |
| 5,221,403 | 6/1993 | Nozawa et al. ............... | 156/345 |
| 5,238,499 | 8/1993 | van de Ven et al. ......... | 118/732 |
| 5,356,515 | 10/1994 | Tahara et al. ................ | 156/643.1 |
| 5,415,728 | 5/1995 | Hasegawa et al. ........... | 156/643.1 |

FOREIGN PATENT DOCUMENTS

| | | | |
|---|---|---|---|
| 3833386 | 4/1988 | Germany. | |
| 0136314 | 7/1985 | Japan ............................ | 118/728 |

Primary Examiner—Thi Dang
Attorney, Agent, or Firm—Oblon, Spivak, McClelland, Maier & Neustadt, P.C.

[57] ABSTRACT

A method of etching oxide film on a semiconductor wafer comprising pushing the wafer against the top of lower electrode while facing it to an upper electrode, decompressing to exhaust a chamber, forming electric field between the wafer and the upper electrode under decompressed state and generating the gas plasma of process gas while supplying the process gas to an oxide-film-formed surface of the wafer through the upper electrode, introducing auxiliary gas to the peripheral portion of the wafer when the gas plasma of process gas is acting on the wafer, and controlling the etching reaction of the gas plasma relative to the peripheral portion of the wafer by auxiliary gas.

47 Claims, 17 Drawing Sheets

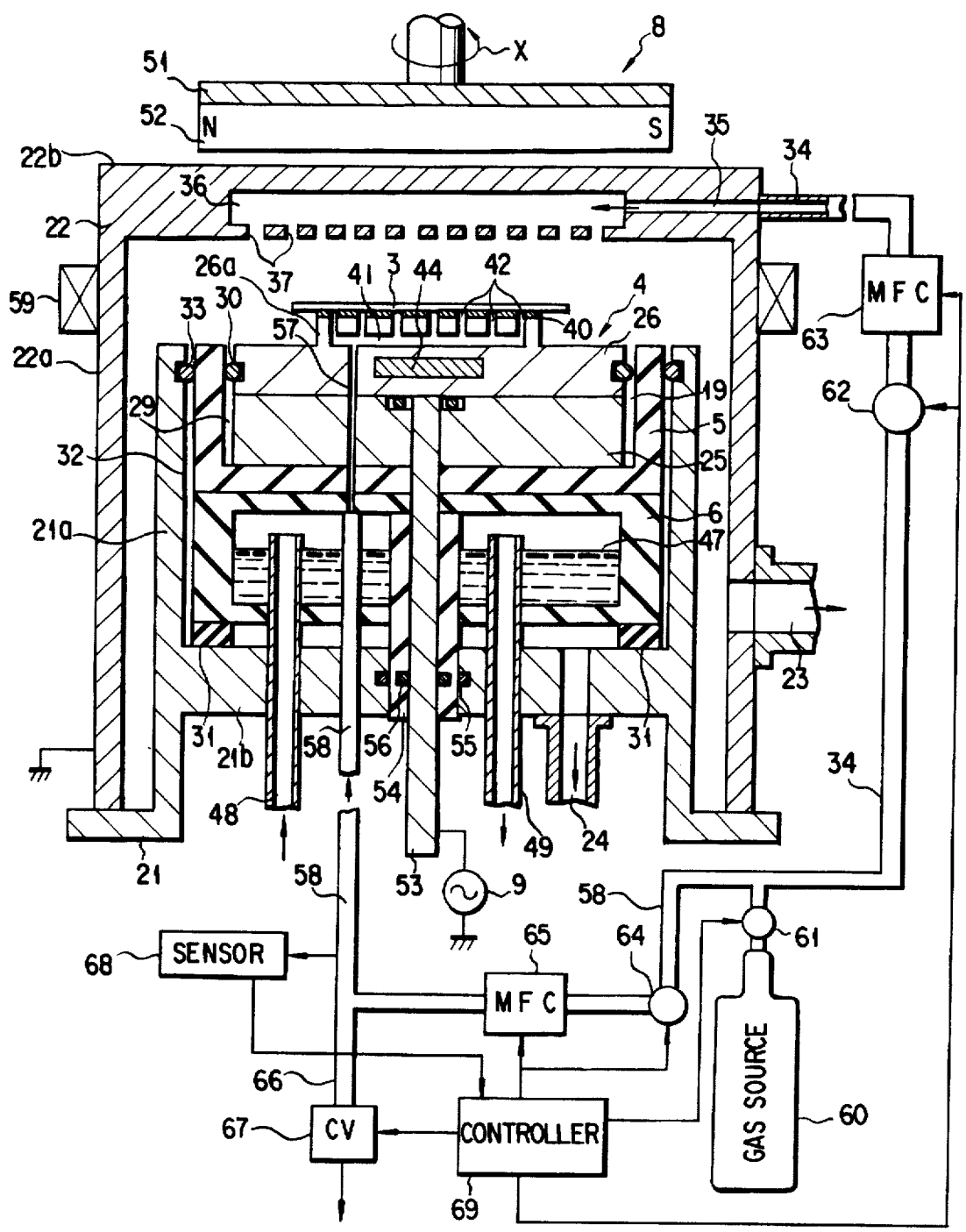
F I G. 1

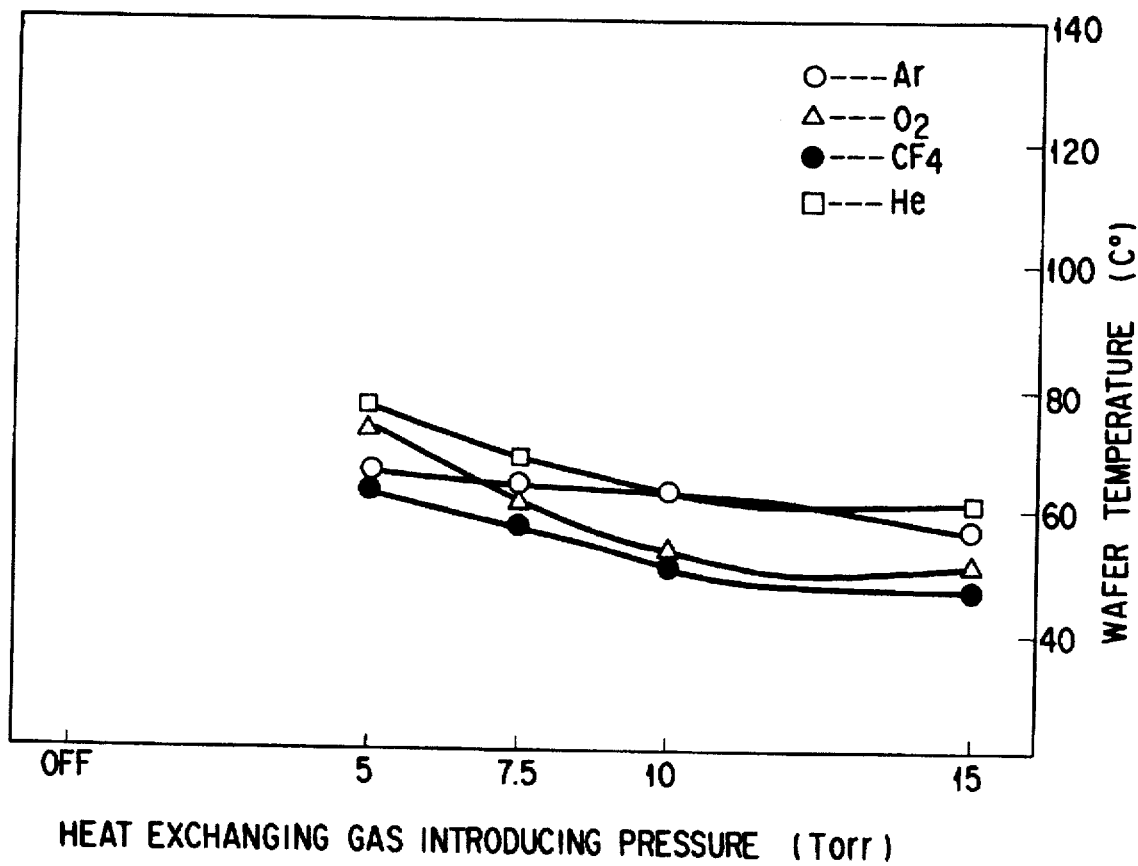
F I G. 5

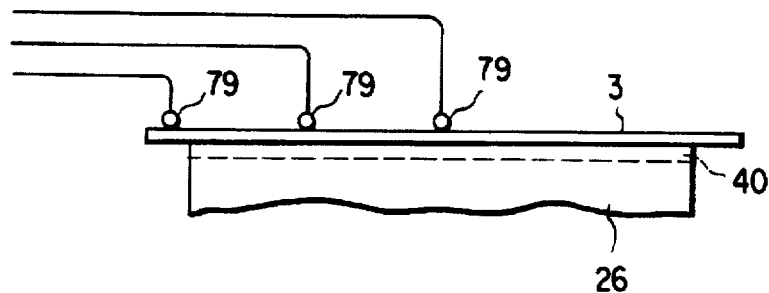
F I G. 6

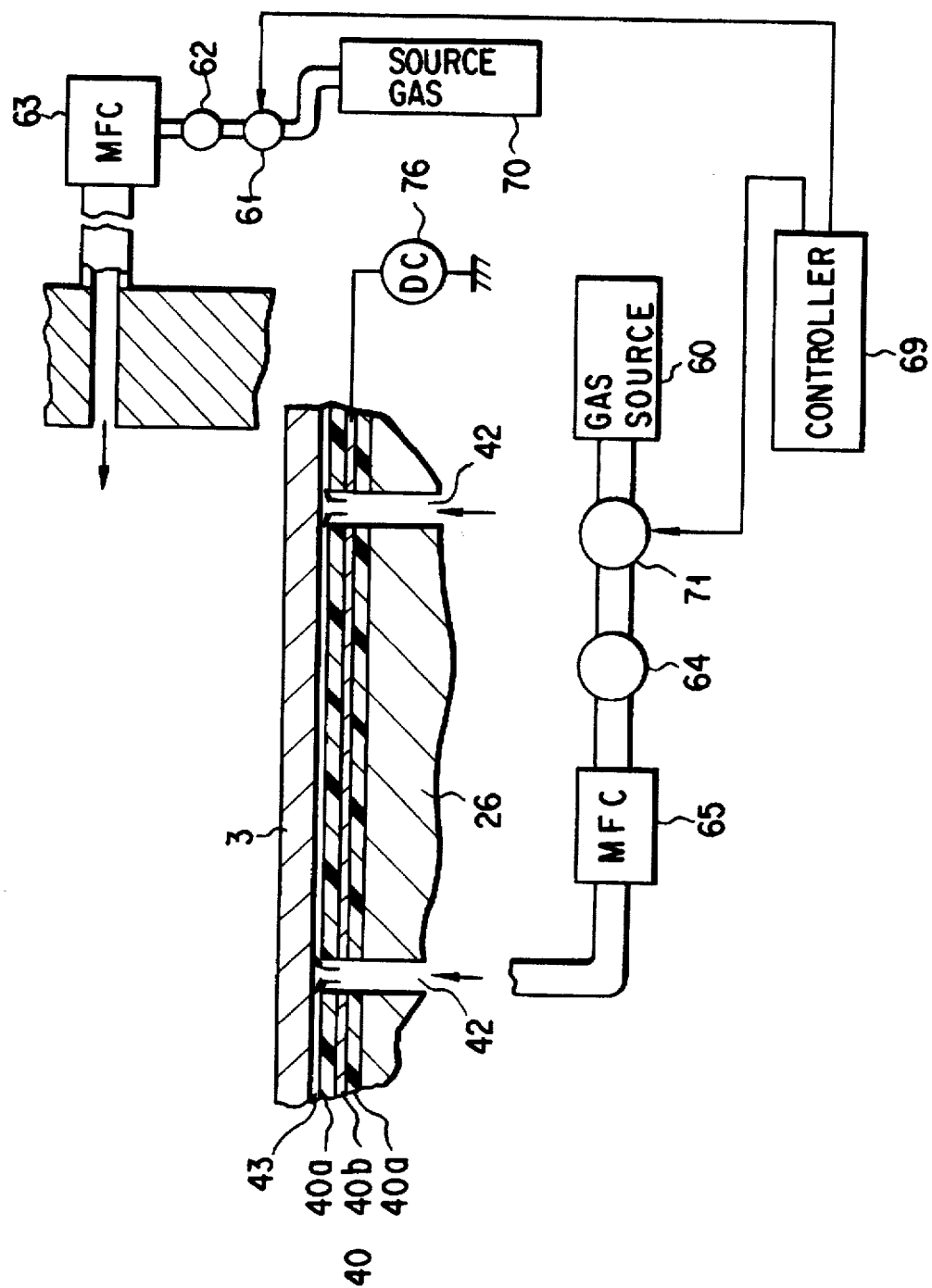
F I G. 10

METHOD OF ETCHING FILM FORMED ON SEMICONDUCTOR WAFER

CROSS-REFERENCES TO THE RELATED APPLICATIONS

This application is a continuation-in-part of U.S. Ser. No. 08/145,179 filed on Nov. 3, 1993, now abandoned, which in turn is a continuation application of U.S. Ser. No. 07/988,669 filed Dec. 10, 1992, U.S. Pat. No. 5,270,266 issued on Dec. 14, 1993.

BACKGROUND OF THE INVENTION

1. Field of the Invention

The present invention relates to a method of etching a film formed on a semiconductor wafer.

2. Description of the Related Art $SiO_2$, SiON, $Ta_2O_5$, $TiO_2$ and other oxide films are etched in the course of forming a super micro-pattern on the semiconductor wafer to produce a super LDI. Various dry etching methods are used for this etching purpose. They are reactive ion (RIE), plasma, sputtering, ECR, magnetron, ion beam etchings, for example. It is asked in these dry etchings that their etching rates are same in the plane of the wafer.

In the conventional etching methods, however, their etching rates are higher in the peripheral portion of the wafer than in the center portion thereof because the amount of etching gas supplied, the density of plasma, and temperature on the surface of the wafer cannot be kept uniform. As their etching rates attained are made higher and higher, nonuniformity in their etching rates in the plane of the wafer becomes larger.

SUMMARY OF THE INVENTION

The object of the present invention is therefore to provide a method of more uniformly etching oxide film on the semiconductor wafer at a higher etching rate.

This object of the present invention can be achieved by a method of etching film on the surface of a semiconductor wafer comprising holding the wafer on a lower electrode to face it to an upper electrode; generating electric field between the wafer and the upper electrode under decompressed state and creating a gas plasma of a process gas between them while supplying the process gas to a film-formed surface of the wafer through the upper electrode; introducing an auxiliary gas to the peripheral portion of the wafer when the gas plasma is acting on the wafer; and controlling the etching reaction of the gas plasma with the peripheral portion of the wafer by the auxiliary gas introduced.

It is the most preferable in this case to introduce the auxiliary gas into a micro-clearance between the wafer and the lower electrode and to blow it into process atmosphere around the wafer. Nozzles may be arranged around the wafer to blow the auxiliary gas to it.

Further, it is preferable that the pressure of the auxiliary gas introduced into the micro-clearance is controlled to be in a range of 3 to 20 Torr. The amount of the auxiliary gas leaked can be controlled by adjusting the force of the holder means with which the wafer is held on it. When this adjusting of the wafer holding force is combined with the controlling of the pressure of the auxiliary gas introduced, the amount of the auxiliary gas leaked can be controlled with a higher accuracy. Particularly in the case of the clamp type etcher, it is effective to adjust the clamping force of the etcher. It is preferable that the amount of the auxiliary gas leaked is in a range of 1 to 50 SCCM. This is because the auxiliary gas disturbs the down-flow of the process gas when the amount of the auxiliary gas leaked becomes more than 50 SCCM.

Still further, it is preferable that a groove is formed in the top of the lower electrode and that the auxiliary gas is introduced into this groove. It is also preferable that this groove is formed like a circle along the outer rim of the wafer. This enables the auxiliary gas to be uniformly supplied all along the rim or peripheral portion of the wafer.

Still further, it is desirable that the auxiliary gas is temperature-controlled (or pre-heated or -cooled) responsive to the temperature of the wafer. The supply of the auxiliary gas may be intermittent. It is not necessarily needed that the pressure of the auxiliary gas introduced is kept certain. Active control may be achieved instead by increasing or decreasing this pressure.

Generally, etching reaction occurs together with polymerizing reaction on the surface of the wafer which is in plasma region. When both of the reactions are balanced each other, an etching rate (ER) can be attained. Gases such as F, Cl, Br and I which include halogen element promote the etching reaction of oxide film but gases which include hydrogen element disturb it. Further, radicals of inactive gases such as He help the peripheral portion of the wafer be etched because they disturb the polymerizing reaction of process gas (such as $CF_4$) and because they give their own charges to the counterpart of impingement to change the counterpart thereof to an etchant.

The following compound and element gases are used as auxiliary gas. They include those capable of becoming gas under normal temperature and pressure, even under decompressed state and also even under high temperature.

1. Saturated hydrocarbon compound (straight chain: $C_xH_{2x+2}$, side chain: i—$C_xH_{2x+2}$)
2. Saturated carbon fluoride compound (straight chain: $C_xF_{2x+2}$, side chain: i—$C_xF_{2x+2}$)
3. Saturated carbon chloride compound (straight chain: $C_xCl_{2x+2}$, side chain: i—$C_xCl_{2x+2}$)
4. Saturated carbon bromide compound (straight chain: $C_xBr_{2x+2}$, side chain: i —$C_xBr_{2x+2}$)
5. Saturated carbon iodide compound (straight chain: $C_xI_{2x+2}$, side chain: i —$C_xI_{2x+2}$)
6. $CBrF_3$, $CFBr_3$, $C_2ClF_5$ and $CClF_3$ which belong to the group of saturated mixed carbon halides and which are represented by $C_vF_wCl_xBr_yI_z$ wherein v, w, x, y and z are optional integers not departed from the etching purpose).
7. $C_2BrF_3$ and $C_2FCl_3$ which belong to the group of unsaturated mixed carbon halides and which are denoted by $C_vF_wCl_xBr_yI_z$ wherein v, w, x, y and z are optional integers not departed from the etching purpose).
8. $CHF_3$, $CHBrF_2$, $CHBr_3$, $CH_2Br_2$, $CHCl_3$ and $C_2HF_2Br_3$ which belong to the group of saturated mixed hydrocarbons and which are represented by $C_\alpha H_\beta F_\gamma Cl_\delta Br_\epsilon I_\zeta$ wherein $\alpha$, $\beta$, $\gamma$, $\delta$, $\epsilon$, and $\zeta$ optional integers not departed from the etching purpose).
9. $C_2HFCl_3$ and $C_2H_2FCl$ which belong to the group of unsaturated mixed hydrocarbons and which are denoted by $C_\alpha H_\beta F_\gamma Cl_\delta Br_\epsilon I_\zeta$ wherein $\alpha$, $\beta$, $\gamma$, $\delta$, $\epsilon$, and $\zeta$ are optional integers not departed from the etching purpose).
10. Unsaturated hydrocarbons ($C_2H_4$, $C_3H_6$, $C_2H_2$, $C_3H_4$)

11. Unsaturated carbon halides ($C_2F_4$, $C_2F_6$, $C_4F_8$, $C_2F_2$, $C_3F_4$, $C_4F_6$)
12. Saturated cyclic hydrocarbons
13. Saturated cyclic carbon halide compounds
14. Unsaturated cyclic hydrocarbon compounds
15. Unsaturated cyclic carbon halides
16. Aromatic compounds (toluene, xylene, phenol)
17. Air, $N_2$, $O_2$, $O_3$, $H_2O$, $H_2O_2$, $H_2$, CO, $CO_2$
18. Inert gases (He, Ne, Ar, Kr, Xe, Rn)
19. Arsenide compounds ($AsH_3$, $R-AsH_2$, $R_2-AsH$, $R_3-As$)
20. Halogen gases and interhalogen compounds ($F_2$, $Cl_2$, $Br_2$, $I_2$, $At_2$, $Cl_3F$, $ICl_3$, ClF, ICl, BrF, $BrF_3$, $BrF_5$, $IF_5$, $IF_7$)
21. Hydrogen halides
22. Boron halides
23. Boron hydrides
24. Halogenoborohydrides
25. Nitrogen halides
26. Sulfur halides ($SF_6$, $S_2F_2$, $S_2F_4$, $S_2Cl_2$, $SCl_6$)
27. Silicon halides
28. Silicon hydrides (silanes): $SiH_4$, $Si_2H_6$, $Si_3H_8$, $Si_4H_{10}$
29. Siliconoborohydrides
30. Alcohols
31. Polyols
32. Ethers and thioethers
33. Ketones (oxo-compounds): Acetone, dimethyl ketone, methyl ethyl ketone (MEK), pinacoline, unsaturated methyloxide, acetophenone, benzophenone, diketones, quinones, cyclic ketone such as cyclohexanone, hydroxylketone, ketonic acid, quinols
34. Carbonyls (oxo-compounds): Carbonyl sulfide (COS), phosgene ($COCl_2$)
35. Carboxylic acids (carboxyl): Formic acid (HCOOH), acetic acid ($CH_3COOH$)
36. Thionyls: Thionyl bromide ($SOBr_2$)
37. Phospholyls: $POCl_3$
38. Phosphorous hidrides: phosphine ($PH_3$), alkyl phosphine ($R-PH_2$)
39. Phosphine halides: $PCl_3$, $PCl_5$, $P_2Cl_4$
40. Sulfuric acid ($H_2SO_4$)
41. Ammonia ($NH_3$)
42. Nitric acid ($HNO_3$)
43. Nitrogen oxides: $N_2O$, NO, $NO_2$, $NO_3$, $N_2O_3$, $N_2O_4$, $N_2O_5$, $N_2O_6$
44. Sulfides: $CS_2$, $H_2S$, $N_2S_2$, $N_4S_4$, $As_4S_4$, $As_2S_3$, $P_4S_7$, $P_2S_5$
45. Sulfur oxides: SO, $SO_2$, $SO_3$, $S_2O$, $S_2O_3$, $S_2O_7$, $SO_4$
46. Phosphoric acid ($H_3PO_4$)
47. Oxygen fluorides: $OF_2$, $O_2F_2$, $O_3F_2$
48. Chlorine oxides: $Cl_2O$, ClO, $ClO_2$, $ClO_3$, $Cl_2O_6$, $Cl_2O_7$, $ClO_4$
49. Bromine oxides: $Br_2O$, $BrO_2$, $BrO_3$, $Br_3O O_8$, $Br_3O_7$
50. Arsenic oxides: $As_2O_3$, $As_2O_5$, $As_2O_4$
51. Cyanogen fluoride: CNF Thermal-$SiO_2$, CVD-$SiO_2$, SiON, $Ta_2O_5$, $TiO_2$, Boron doped Phospho Silicate Glass (BPSG), Phospho Silicate Glass (PSG), Boron Silicate Glass (BSG), Arsenic Silicate Glass (AsSG), $SiO_2$-SixNy-$SiO_2$ (ONO), TEOS, SOG, Plasma-$Si_3N_4$, Al, Al—Si alloy, Al—Cu alloy, Al—Si—Cu alloy, Ni—Cr alloy, W, Mo, Si, PolySi, Phosphorus doped PolySi, Ga, As, Ga—As, Ti/Pt, Ti/Au, TiWN/Al, Au/W, Au/Cr, Au/Mo, Ti/Pt/Au, AuPd/Ti, AuW/Ti, AuMo/Ti, Au/Pd/Ti/PdSix, Au/Pt/Ti/PtSix, Au/W/Ti/PtSix, TiSix, WSix, MoSix, TaSix, PtSix, PdSix, Pb.$SiO_2$, Pb.$SiO_2$, PbO.$SiO_2$, PbO.$Al_2O_3$.$SiO_2$, PbO.$B_2O_3$.$SiO_2$, SiOxNy, PbO.$Al_2O_3$.$B_2O_3$.$SiO_2$, PSG/$SiO_2$, $SiO_2$/PSG/$SiO_2$, $Al_2O_3$, sapphire, quartz and others are included as films to be etched.

The pressure of auxiliary gas introduced is controlled by adjusting clamping force when the etcher of the clamp type is used or adjusting voltage when the etcher of the electrostatic chuck type is used, while keeping certain the of gas supplied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional block diagram schematically showing the etching apparatus in which the dry etching method according to a first embodiment of the present invention is employed;

FIG. 5 is a plot view showing how wafer temperatures measured are related to pressures under which various heat exchanging gases are supplied;

FIG. 6 shows those positions at which the temperature of wafer is measured;

FIG. 10 is a sectional block diagram showing a part of the etching apparatus in which the dry etching method according to a second embodiment of the present invention is employed;

DETAILED DESCRIPTION OF THE PREFERRED EMBODIMENTS

Figure 2:
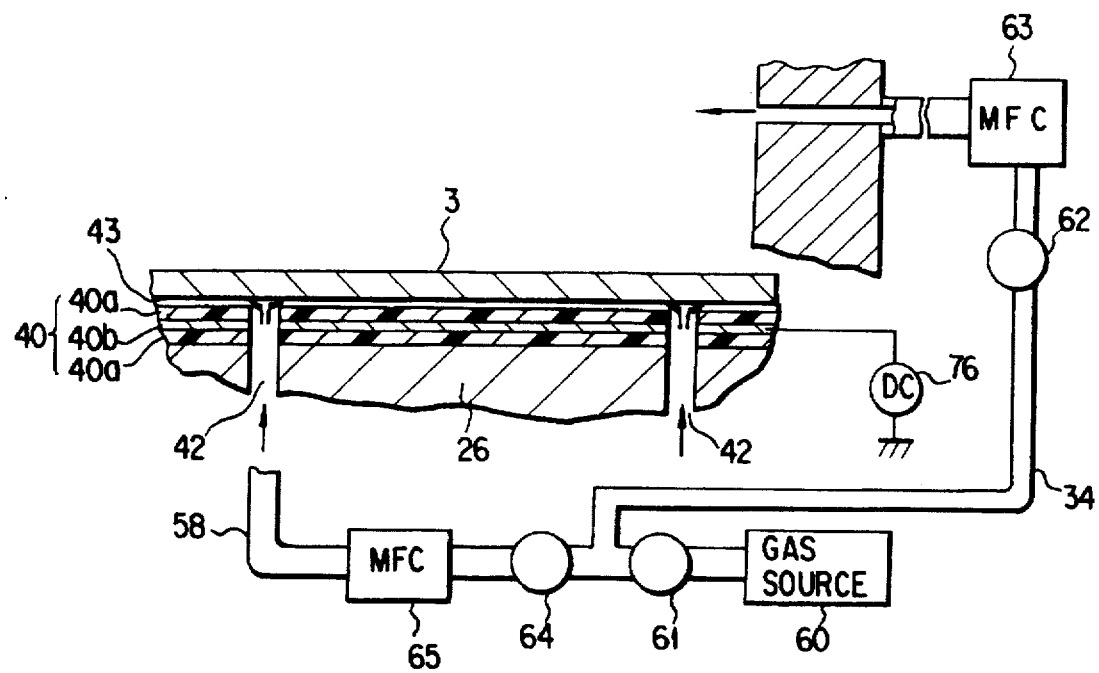
FIG. 2 is a vertically-sectioned view showing an upper portion of the susceptor enlarged.

Some dry etching methods of the present invention will be described with reference to the accompanying drawings.

FIG. 1 is a vertically-sectioned view schematically showing a magnetron plasma etching apparatus 8. This magnetron plasma etching apparatus 8 includes a reduced pressure chamber, a susceptor 4, an insulating section 5, a cooling jacket 6, a gas supply source 60, a magnet section 8 and an RF power source 9. Gas supply and exhaust pipes or conduits are communicated with the chamber. A semiconductor wafer 3 is mounted on the top of the susceptor 4, which is housed and made electrically floating in the ceramics-made insulating section 5. The cooling jacket 6 is contacted heat-exchangeable with the susceptor 4 through the insulating section 5. A magnet 52 for generating magnetic field is attached to a rotary disk 51 at the magnet section 8. The RF power source 9 is connected to the susceptor 4 via a rod electrode 53.

The reduced pressure chamber includes lower and upper chamber portions 21 and 22. The lower chamber portion 21 comprises a side wall 21a enclosing side walls of the support table housing section 5 and the liquid nitrogen housing section 6, and a bottom wall 21b for supporting the sections 5 and 6. The upper chamber portion 22 comprises a cylindrical side wall 22a enclosing the side wall 21a of the lower chamber portion 21, and a top wall 22b which serves as an upper electrode. The exhaust pipe 23 is connected to the lower portion of the side wall 22a of the upper chamber portion 22 and a vacuum pump (not shown) is connected to the exhaust pipe 23. When the vacuum chamber is exhausted by this exhaust means, therefore, it can be decompressed up to about $10^{-6}$ Torr. Another exhaust pipe 24 is connected to the bottom wall 21b of the lower chamber portion 21 and the reduced pressure chamber can also be exhausted through this exhaust pipe 24 by an exhaust means (not shown).

The susceptor 4 includes a lower member 25 and an upper member 26 detachably attached to the lower member 25.

The upper member 26 has a disk-like projection 26a at the central portion thereof and an electrostatic attracting sheet 40 lies on the projection 26a. The wafer 3 is held onto the projection 26a, with the electrostatic attracting sheet 40 interposed between them, by Coulomb force. The electrostatic attracting sheet 40 comprises an insulating sheet 40a made of polyimide, for example, and a conductive sheet 40b made of copper and embedded in the insulating sheet 40a. The conductive sheet 40b in the insulating sheet 40a is connected to a DC power source (not shown).

The wafer 3 is mounted and attracted onto the electrostatic attracting sheet 40 on the first susceptor member 26. The electrostatic attracting sheet 40 is of such type that draws and holds the wafer 3 to it by Coulomb force. The electrostatic chuck system of the monopole type, for example, is used in this case. In short, a conductive layer is interposed between two insulating sheets to form the electrostatic attracting sheet 40 and high voltage is applied to the conductive layer while the wafer is set to have different potential through plasma which will be described later. As the result, Coulomb force acts between them to attract each other.

The first susceptor member 26 is detachably fixed to the top of the second susceptor member 25. The reason why the susceptor is divided into two members in this manner is that only the first upper susceptor member 26 may be exchanged with a new one when the susceptor is contaminated. This makes it easier to maintain the susceptor.

The bottom and side walls of the first and second susceptor members 25 and 26 are covered by the ceramics-made insulating section 5. The liquid nitrogen housing section 6 which serves as the cooling jacket is arranged under the insulating section 5. The inner bottom face of the cooling jacket 6 is made porous to create nuclear boiling and liquid nitrogen in the cooling jacket 6 can be kept $-196°$ C.

A ceramic heater 44 is embedded in the first susceptor member 26. This heater 44 serves to heat the too-cooled wafer 3. In short, the temperature of the water 3 can be micro-adjusted by the heater 44.

The side wall and bottom of the susceptor 4 are covered by the insulating section 5. A clearance 29 is formed between the inner side wall face of the insulating section 5 and the susceptor 4 and an O-ring 30 seals the clearance 29 at the upper end of the susceptor 4. Another clearance 32 is formed between the inner face of the side wall 21a of the lower chamber portion 21 and the outer face of the side walls of the insulating section 5 and the cooling jacket 6 and an O-ring 33 seals the clearance 32 at the upper end of the insulating section 5. These O-rings 30 and 33 make the clearances 29 and 32 serve as vacuum heat insulating lasers. These clearances 29 and 32 are exhausted through the exhaust pipe 24.

The RF power source 9 is connected to the upper susceptor member 26 through the conductive rod 53. The upper susceptor member 26 serves as a lower electrode. An insulating sleeve 54 into which the conductive rod 53 is inserted reaches the inner face of the top of the cooling jacket 6, passing through the bottoms of the lower chamber portion 21 and the cooling jacket 6. An O-ring 55 is interposed between the bottom 21b of the lower chamber portion 21 and the insulating sleeve 54 and another O-ring 56 between the insulating sleeve 54 and the conductive rod 53.

The top 22b of the upper chamber portion 22 is earthed and this top 22b and the support table 4 to which the RF power source 9 is connected and which serves as the lower electrode form a pair of parallel plate electrodes and electric field of high frequency is created between them.

The magnet section 8 includes the support member 51 arranged parallel just above the upper chamber member 22, the permanent magnet 52 supported by the support member 51, and a motor (not shown) for rotating the support member 51 and the permanent magnet 52 in a direction shown by X in FIG. 1. Parallel magnetic field can be thus uniformly created on the surface of the wafer. Orthogonal electromagnetic fields are created between the top 22b of the upper chamber member 22 and the susceptor 4 by high frequency electric field and parallel magnetic field. Magnetron discharge can be thus realized.

As shown in FIG. 2, process and heat exchanging gases are supplied from a $CF_4$ gas supply source 60 in this case. A regulator 61 is attached to the gas supply source 60 to reduce gas pressure from 50 kg/cm² to 2 kg/cm². Another regulator 62 is attached to a pipe 34 on the process line to secondarily reduce gas pressure from 2 kg/cm² to 0.7 kg/cm². The flow rate of process gas supplied into the chamber is adjusted by a mass flow controller 63. A DC power source 76 is connected to a conductive layer 40b of the electrostatic attracting sheet 40.

A regulator 64 is attached to a conduit 58, through which heat exchanging gas is supplied to interstices 43, to decompress gas pressure from 2 kg/cm² to lower than 0.7 kg/cm². A sensor 68 is attached to the conduit 58 and it is connected to the input of a controller 69, as shown in FIG. 1. A regulator 64 and MFC 65 are controlled responsive to detection signals applied from the sensor 68.

A through-hole is passed through the first and second susceptor members 26 and 25, the insulating ceramic 5, and the liquid nitrogen containing section 6 to form a conduit 58. Interstices 43 exist between the wafer 3 and the electrostatic attracting sheet 40 because the underside of the wafer 3 is uneven when seen on a microscopic scale. The interstices 43 lowers the heat exchanging efficiency to thereby cause the temperature distribution all over the wafer 3 not to become uniform. When the interstices 43 is filled with heat exchanging gas having a certain pressure and supplied through the conduit 58, however, the temperature distribution can be made uniform all over the wafer 3. As shown in FIG. 2, the sheet 40 for electrostatically attracting the wafer 3 on the first susceptor member 26 has gas introducing apertures 42 which are formed along a peripheral portion of the sheet 40 at a certain interval to correspond to the peripheral portion of the underside of the wafer 3. Heat exchanging gas supplied through the conduit 58 is therefore introduced under the certain pressure into the interstices 43 through the gas introducing apertures 42.

Figure 3:
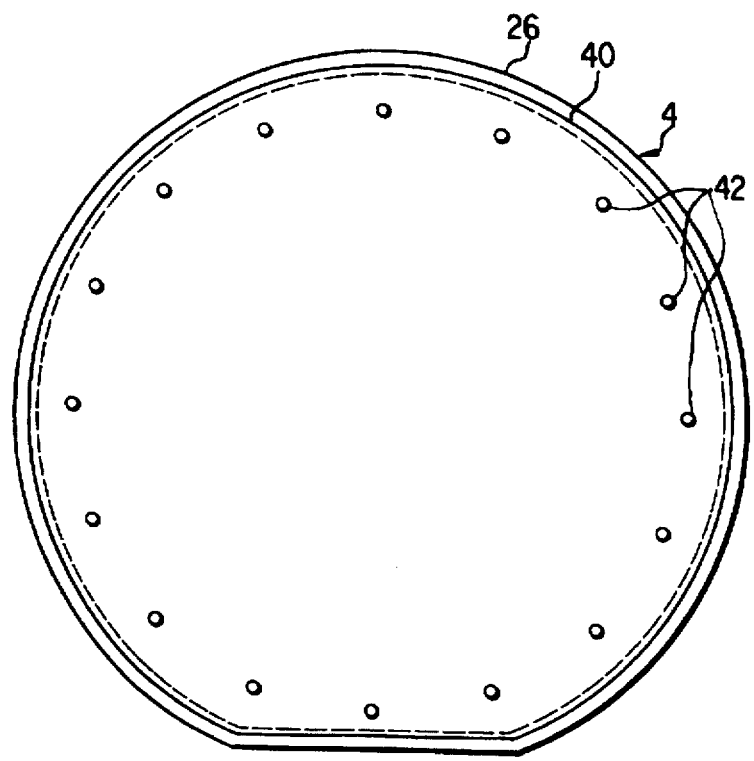
FIG. 3 is a plan view showing the top of the susceptor.

As shown in FIG. 3, sixteen apertures 42 are formed along the peripheral portion of the electrostatic attracting sheet 40 at same interval. Heat exchanging gas is introduced into the interstices 43 through these apertures 42. Each of the apertures 42 is communicated with a passage 57 through a header 41, as shown in FIG. 1. That portion of each of the apertures 42 which is opened at the top of the electrostatic attracting sheet 40 has a diameter of 0.8 mm and it is separated from the outer rim of the sheet 40 by 8 to 10 mm.

Figure 4:
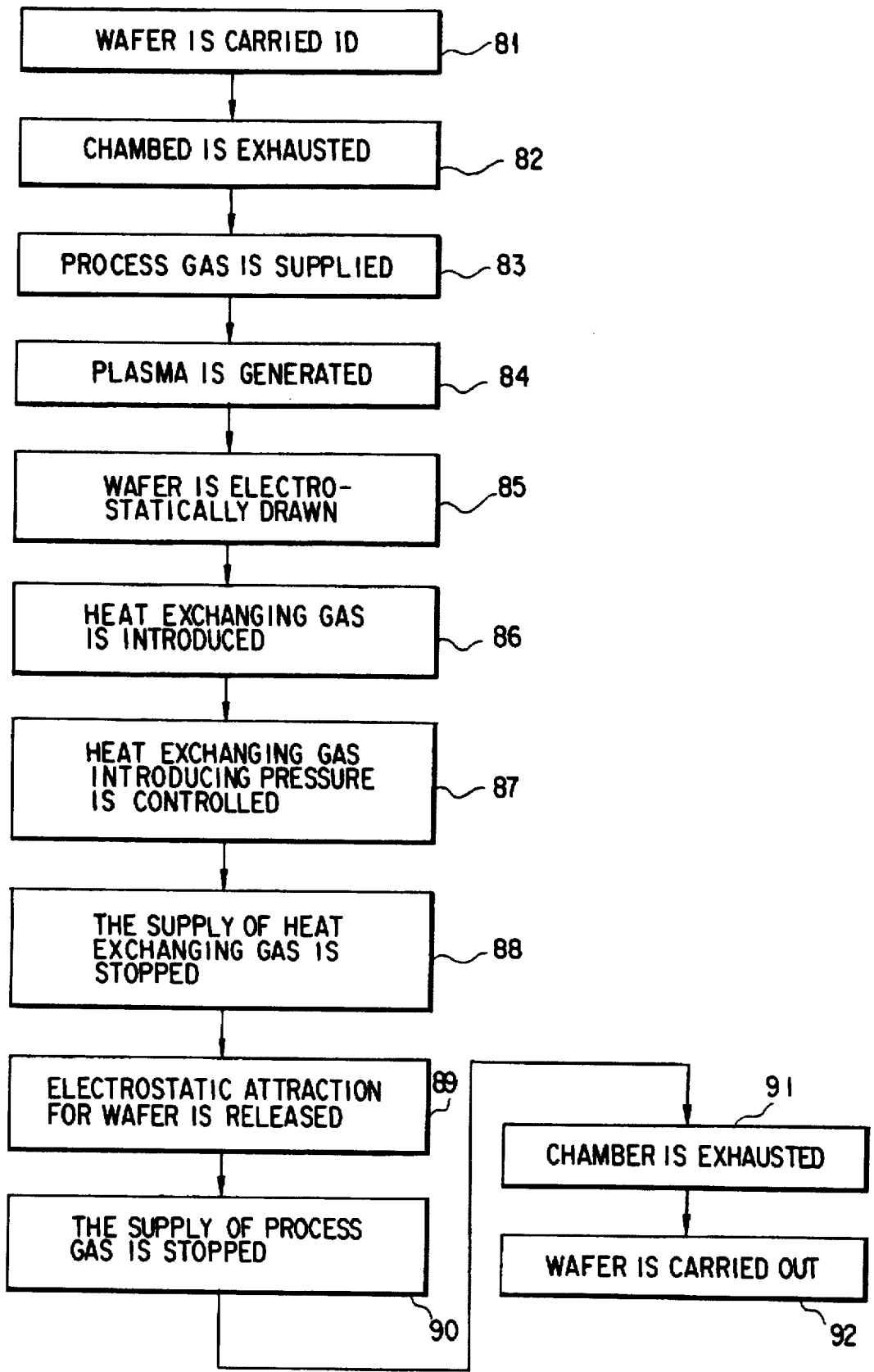
FIG. 4 is a flow chart showing how the dry etching method is carried out.

Referring to FIG. 4, it will be described how the semiconductor wafer is dry-etched.

The silicon wafer 3 of eight-inch diameter is carried into the chamber and mounted on the susceptor 4 (Step 81). The gate (not shown) through which the wafer 3 is carried into and out of the chamber is closed and the chamber is then exhausted to have a certain basic pressure in it (Step 82).

When it is detected that the chamber is decompressed to the certain basic pressure, signals are sent from the controller 69 to the pressure adjusting valves 61, 62 and the MFC 63 to supply $CF_4$ gas into the chamber through the pipe 34 (step 83). $CF_4$ gas is introduced into the chamber at a flow rate of 50 SCCM. The exhaust conductance is adjusted this time to keep chamber pressure at about 40 mTorr. Etching gas is introduced into plasma creating area through the pipe 34, an opening 35, a space 36 and scattering holes 37. High frequency power is supplied under this state from the RF power source 9 to between the top 22b of the upper chamber portion 22 and the susceptor 4. Parallel magnetic field is applied from the magnet 52 to between the electrodes and orthogonal electromagnetic fields are thus formed on the surface of the wafer 3. This enables magnetron discharge to be created against the surface of the wafer 3. As the magnet 52 is being rotated, this magnetron discharge can be uniformly excited. In the case of this magnetron discharge, electrons present between the electrodes play cyclone movement to collide against molecules. The times at which molecules are ionized are thus increased and a high etching speed of 1 μm/min can be therefore achieved even when the pressure is relatively low or in a range of $10^{-2}$ to $10^{-3}$ Torr. The magnetron discharge enables the etching not only to be made under low pressure but also to have a more excellent anisotropy. RF power is supplied between the upper chamber portion 22 and the first susceptor member 26 in this manner and plasma of high density is generated while rotating the magnet 52 (Step 84).

High voltage is applied to the electrostatic attracting sheet 40 and Coulomb force is thus created between the wafer 3 and the sheet 40 to electrostatically attract and draw the wafer 3 to the sheet 40 (Step 85).

The wafer 3 receives the radiation heat to plasma to thereby raise its temperature in the course of the dry etching process. The wafer 3 must be therefore cooled to enhance etching characteristics. Liquid nitrogen 47 is thus circulated through the cooling jacket 6 to cool the susceptor members 25 and 26. In addition, the upper susceptor member 26 is heated by the heater 44 to micro-adjust the temperature of the wafer 3. The cooling temperature is set to control the lower susceptor member 25 to a temperature of 20° C. Signals are applied this time from the controller 69 to the valve 64 and the MFC 65 to supply $CF_4$ gas into the conduit 58. $CF_4$ gas is introduced into the interstices 43, passing through the passage 57, the header 31 and the apertures 42 (Step 86).

$CF_4$ gas in the interstices 43 flows from the rim portion of the underside of the wafer 3 toward the center thereof. When $CF_4$ gas is scattered in the whole of the interstices 43, heat exchanging between the wafer 3 and the susceptor 4 is increased. The pressure under which $CF_4$ gas is introduced is controlled to be a desired value within a range of 1 to 30 Torr at the sensor 68 (Step 87). When the gas introducing pressure becomes smaller than the smallest value in this range, gas is insufficiently scattered in the interstices 43. When it becomes larger than the largest value in the range, however, the wafer 3 is caused to depart from the top of the susceptor 4. It is therefore needed that the gas introducing pressure is determined considering how this pressure is balanced Coulomb force applied from the electrostatic attracting sheet 40.

The electrostatic attracting sheet 40 of the susceptor 4 exchanges heat with the wafer 3 through $CF_4$ gas introduced. Even when this heat exchanging gas is leaked into the process area, it does not add any bad influence to the etching because it is also used as process gas in this case.

When a certain time period is passed after the start of the etching process, the introduction of heat exchanging gas is stopped (Step 88). Power supply to the sheet 40 is then stopped to release the wafer 3 from its being electrostatically attracted by the susceptor 4 (Step 89). The supply of process gas is stopped to finish the dry etching process (Step 90). Gas remaining in the chamber is exhausted (Step 91). The gate of the chamber is opened to allow the wafer 3 to be carried out of the chamber (Step 92).

FIG. 5 is a plot diagram showing how wafer temperatures measured are related to heat exchanging gas supply pressures set when the heat exchanging gas used is variously changed under the above-mentioned process conditions. Paint circles in FIG. 5 denote results obtained relating to $CF_4$ gas (in the first embodiment of the present invention), blank rectangles those obtained relating to helium gas (in a comparison example), blank circles those obtained relating to argon gas (in another comparison example), and blank triangles those obtained relating to oxygen gas (in a further comparison example). Temperature was measured at the center portion of the wafer 3. As shown in FIG. 5, the heat exchanging efficiency of $CF_4$ gas is the most excellent as compared with those of helium, argon and oxygen gases.

As apparent from FIG. 5, too, the temperature of the wafer 3 can be made lower as the gas introducing pressure becomes higher. The heat exchanging gas introducing pressure is usually selected from, values in a range of 1 to 30 Torr. This is because a described heat exchanging rate cannot be obtained when the pressure becomes small than 1 Torr. This is also because the wafer 3 is caused to float from the susceptor 4 against Coulomb force applied from the sheet 40 when the pressure becomes larger than 30 Torr. In other words, electrostatic attraction force applied from the sheet 40 to the wafer 3 is reduced, thereby causing the heat exchanging gas introducing pressure to exceed this force, when dust and particles are present, even if a little, in the interstices 43. In addition, the amount of gas leaked from the interstices 43 into the chamber increases more and more as the gas introducing pressure becomes larger. It is therefore preferable in this case that the pressure is controlled to be in a range of 5 to 15 Torr. As apparent from data shown in FIG. 5, too, it is preferable to set the pressure in a range of 7.5 to 15 Torr. The heat exchanging rate between the wafer and the susceptor under this pressure range can be kept substantially unchanged.

Description will be made about the leakage of heat exchanging gas.

Although extremely fine on a microscopic scale, a gas exists between the wafer 3 and the electrostatic attracting sheet 40 along their circumferential rim portion. Heat exchanging gas leaks process area through this interstices 43. Heat exchanging gas is same as etching gas in the case of this embodiment. Even when heat exchanging gas is leaked, therefore, any influence is not added to the etching process. In the case where heat exchanging gas is leaked and made plasma in the chamber, ions in the plasma can have same components as those obtained when etching gas is plasma. In addition, $CF_4$ gas produces no component deposited. This prevents the wafer 3 and the inner wall face of the chamber from being contaminated.

Referring to FIGS. 6 through 9, it will be described how the temperature of wafer is changed when those positions at which heat exchanging gas is introduced are changed.

As shown in FIG. 6, temperature detecting terminals 79 were arranged at the peripheral, middle and center portions of the top of the wafer 3 and the temperature of the wafer 3 was adjusted while variously changing, under the above-mentioned process conditions in the first embodiment, the pressure under which heat exchanging gas was supplied.

Figure 7:
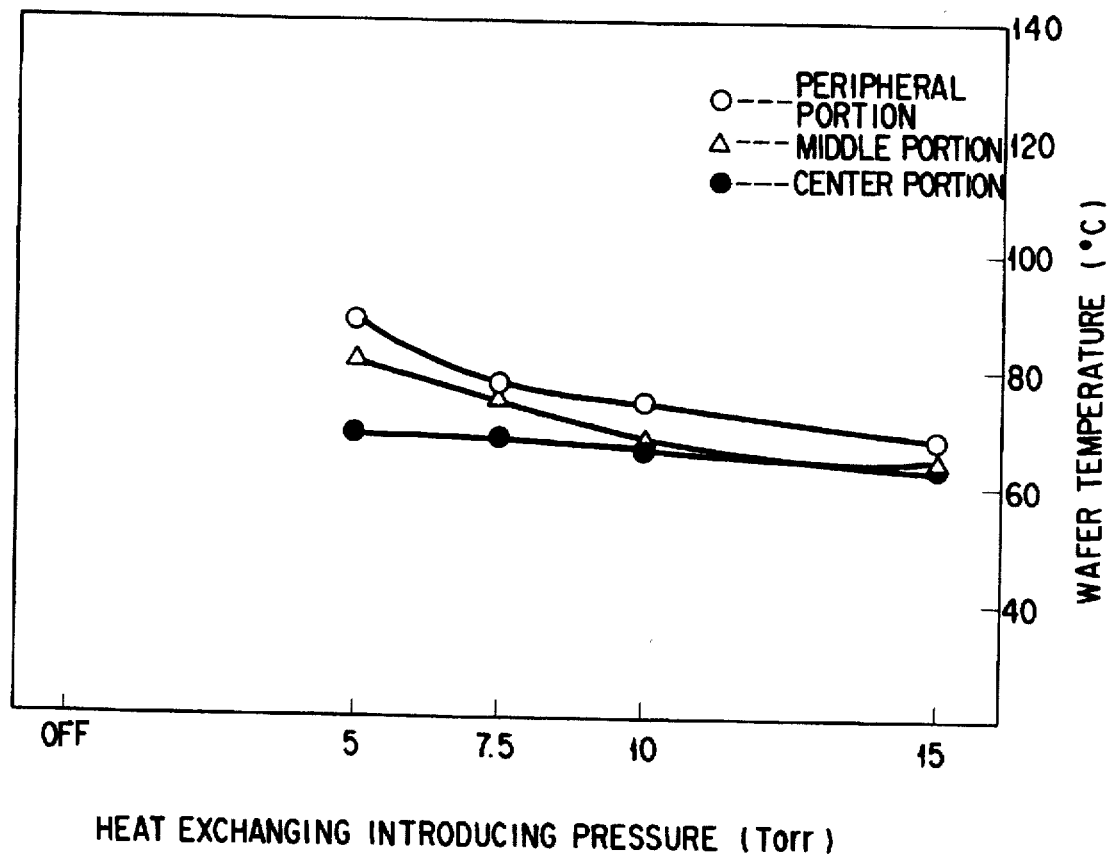
FIG. 7 is a plot view showing how wafer temperatures measured are related to pressures under which heat exchanging gas is supplied when those positions at which the temperature of a wafer is measured are changed.

In FIG. 7, pressures under which heat exchanging gas is introduced are plotted on the horizontal axis and temperatures of wafer on the vertical axis. FIG. 7, therefore, is a plot diagram showing how gas introducing pressures are related to temperatures of wafer when they are measured using susceptor 4. In FIG. 7, blank circles denote results obtained at the peripheral portion of the wafer, blank triangles those obtained at the middle portion thereof, and point circles those obtained at the center portion thereof. As apparent from FIG. 7, temperature difference between values obtained at the peripheral and center portions of the wafer becomes smaller as the gas introducing pressure is made larger. When the gas introducing pressure is made 5 Torr, the temperature difference is 20° C., but when it is made 15 Torr, the temperature difference is smaller than 10° C.

Figure 8:
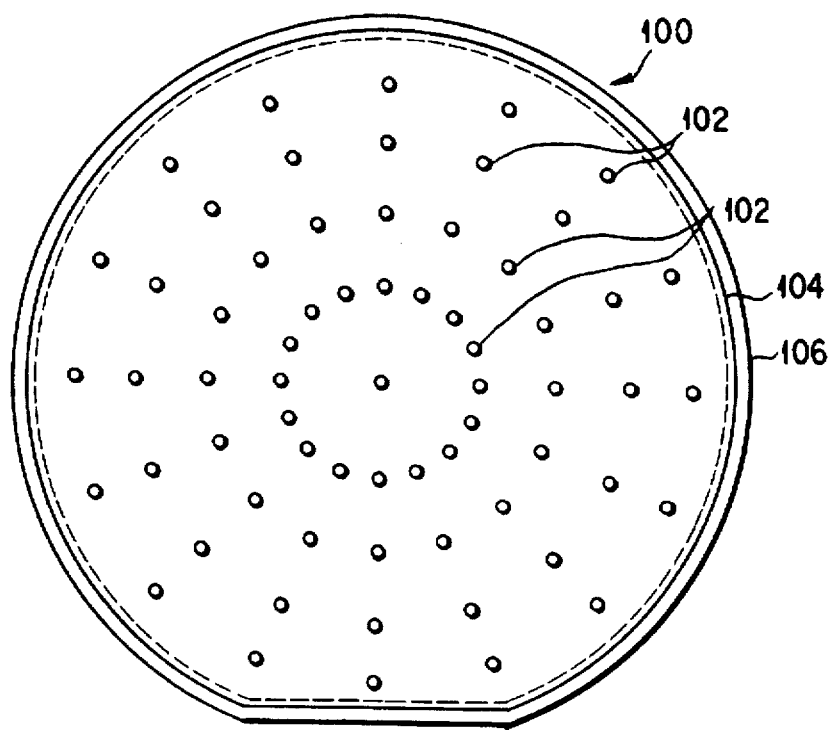
FIG. 8 is a plan view showing the conventional susceptor.

In the case of a susceptor 106 of a conventional etching apparatus 100, gas introducing openings 102 are arranged almost all over an electrostatic attracting sheet 104, as shown in FIG. 8. The temperature of the wafer 3 was adjusted, using the susceptor 106 while variously changing, under the above-mentioned process conditions, the pressure under which heat exchanging gas was supplied.

Figure 9:
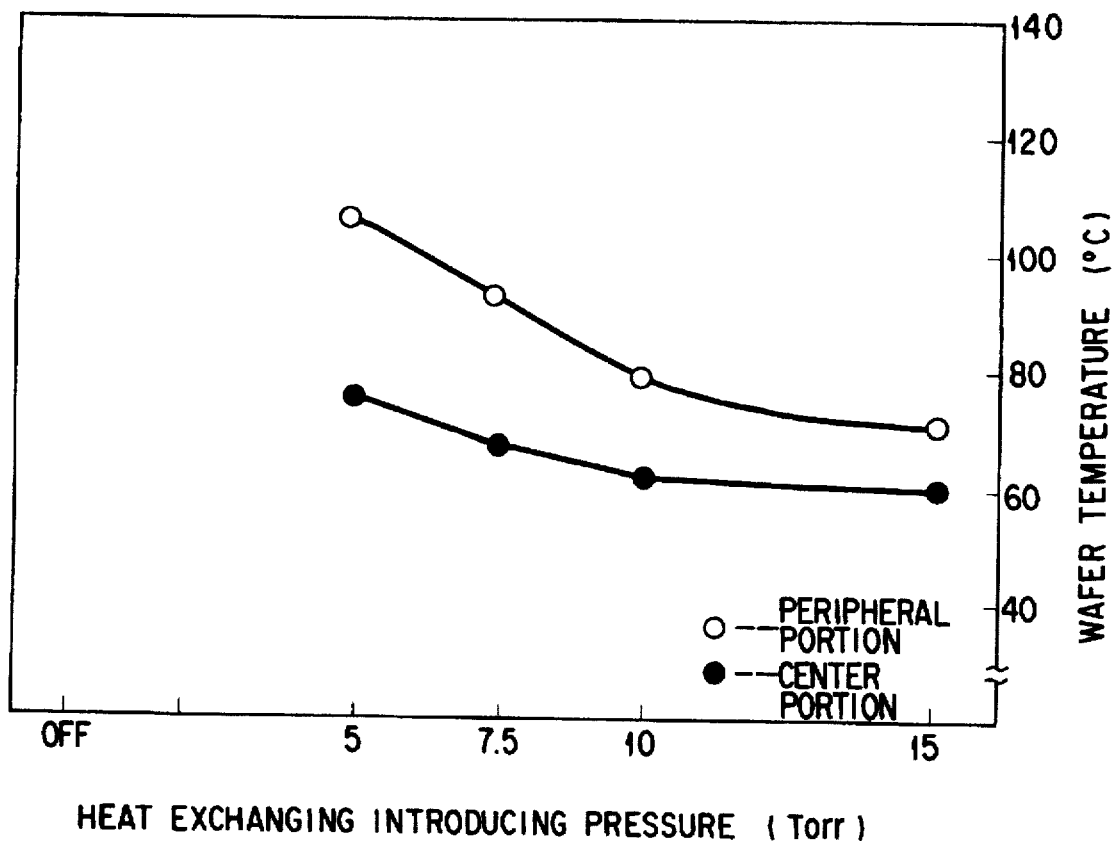
FIG. 9 is a plot view showing how wafer temperatures measured are related to pressures under which heat exchanging gas is supplied when the conventional susceptor is used.

Plotting gas introducing pressures on the horizontal axis and wafer temperatures on the vertical axis, FIG. 9 shows how both of them are related to each other when they are measured using the susceptor 106. In FIG. 9, black circles represent results obtained at the peripheral portion of the wafer 3 and point circles those obtained at the center portion thereof. As apparent from FIG. 9, temperatures obtained at the peripheral portion of the wafer and at the center portion thereof become different, ranging even from 10° to 40° C. Further, electrostatic attraction force applied to the center portion of the wafer is reduced according to the conventional susceptor 106 shown in FIG. 8. It is therefore dangerous that the gas introducing pressure is increased.

According to the susceptor 4 shown in FIG. 3, however, heat exchanging gas is introduced into the interstices 43 under and along the peripheral portion of the underside of the wafer 3, passing through the apertures 42. Heat exchanging gas is then spreaded under the whole of the underside of the wafer 3 so that a desired heat exchanging rate can be achieved between the wafer and the susceptor. Further, a desired electrostatic attraction force can be applied to the wafer 3 because no gas introducing aperture is provided at the center portion of the wafer 3.

As apparent from FIGS. 7 and 9, the uniformity of temperature distribution on the wafer 3 can be enhanced to a greater extent in the case of the first embodiment than in the case of the conventional method. As the result, the etching process can be made more uniform in the wafer 3 in the case of the first embodiment.

A second embodiment of the present invention will be described with reference to FIG. 10. Description on same components as those in the first embodiment will be omitted.

$CHF_3$ gas is used as etching gas and $CF_4$ gas as heat exchanging gas in the second embodiment. Etching and heat exchanging gas supply sources 60 and 70 are provided independent of the other and d $CHF_3$ gas is supplied from the etching supply source 70 into the chamber while $CF_4$ gas from the heat exchanging gas supply source 60 into the interstices 43. Regulators 61 and 71 attached to both gas sources 60 and 70 are controlled by the controller 69.

Consideration will be paid to the leakage of heat exchanging gas.

$CF_4$ gas having components almost similar to those of $CHF_3$ gas which is used as etching gas is used as heat exchanging gas in the second embodiment. Even when $CF_4$ gas is leaked, therefore, any substantial influence is not added to the etching process. In the case where the heat exchanging gas is leaked and made plasma in the chamber, ions in the plasma can have same components as those of ions created when the etching gas is made plasma. Further, $CF_4$ gas creates no components deposited and this presents the wafer 3 and the inner wall face of the chamber from being contaminated. When $CF_4$ gas is compared with $CHF_3$ gas in this point, the latter is likely to produce components deposited because it contains hydrogen in its components.

Although $CHF_3$ gas has been used as etching gas and $CF_4$ gas as heat exchanging gas in the second embodiment, the present invention is not limited to these gases. $Cl_2$ gas may be used as etching and heat exchanging gases. Or $SF_6$ gas may be used as etching and heat exchanging gases. In other words, any of gases which are higher in heat exchanging rate than helium gas and which have same components as at least some of those of the etching gas may be used as heat exchanging gas.

When plural process gases are used, any of gases which have same components as at least some of those of the plural process gases and which are higher in heat exchanging rate than helium gas may be used as heat exchanging gas.

Although the dry etching process has been cited in the above-described embodiments, the present invention may be applied to the sputtering, ions-injecting, decompressing CVD processes.

Although the electrostatic attracting sheet has been used as the chuck means for holding and fixing the semiconductor wafer on the susceptor, other means such as the mechanical clamp may be used.

Inventors of the present invention have found that etching rate can be made high and the uniformity of etching rates in a plane of the wafer can be improved due to gas leaked into process atmosphere when the gas is introduced into the micro-clearance between the wafer and the lower electrode. After using various kinds of gas, they have also found that some of these gases distribute to promoting the etching in the peripheral portion of the wafer and the other to disturbing the etching there.

Some embodiments of the present invention will be described with reference to the accompanying drawings.

Figure 11:
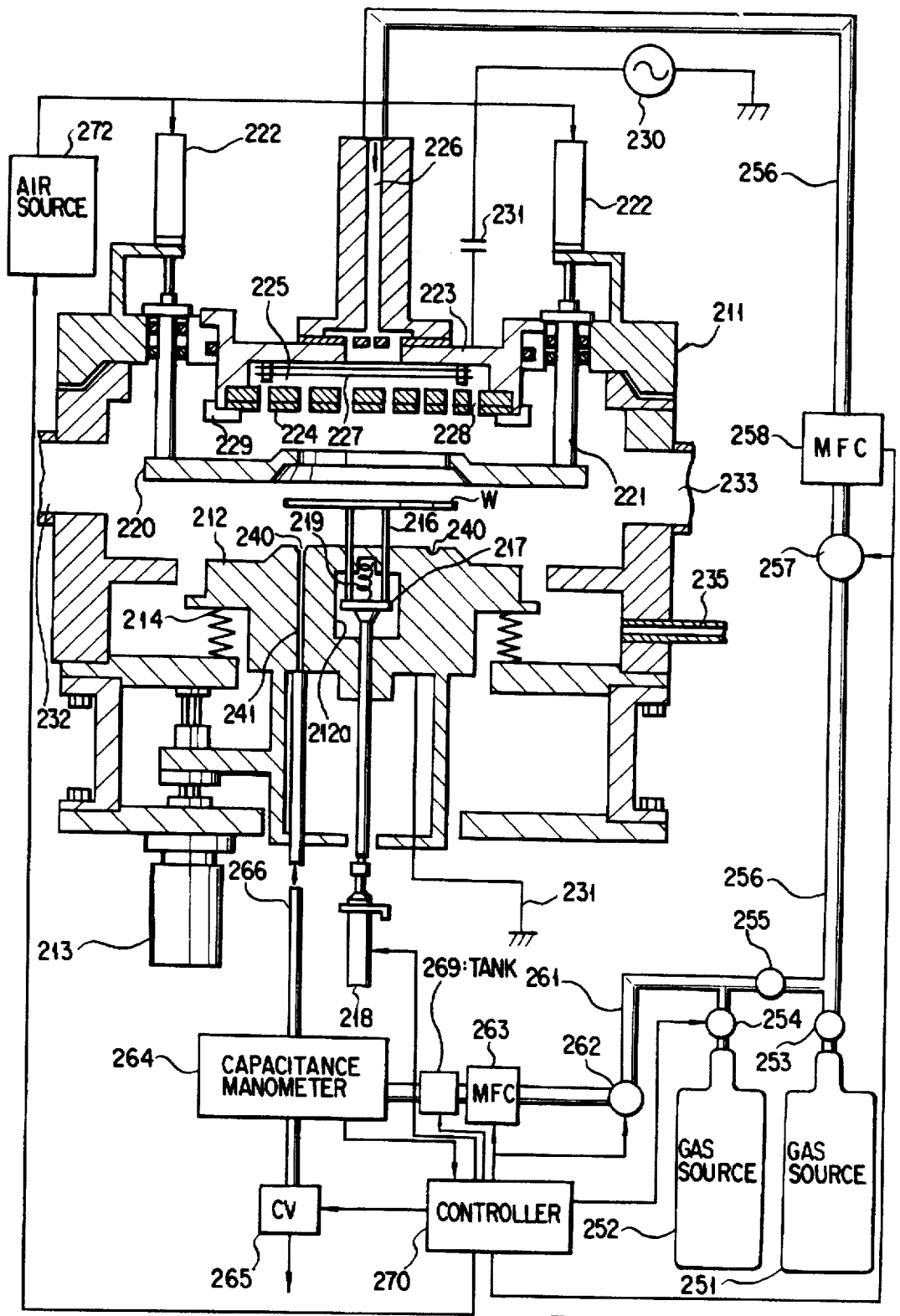
FIG. 11 is a vertically-sectioned view showing a plasma etching apparatus of the clamping type.

As shown in FIG. 11, the plasma etching apparatus has a process chamber 211 which can be kept substantially air-tight. This process chamber 211 is made of aluminium to the surface of which anodic oxidation process has been applied.

A lower electrode 212 is arranged in the lower portion of the process chamber 211. This lower electrode is also made of aluminium to the surface of which anodic oxidation process has been applied.

A piece of polyimide sheet (20 to 200 µm, not shown) has been further applied to the surface of the electrode 212 as occasion requires and the surface roughness has been restricted to be lower than 8 µm. The lower electrode 212 has a wafer mount, trapezoidal in section, in the center portion thereof and a semiconductor wafer W is mounted on it. A ring-shaped groove 240 is formed in it, running along the outer rim of the wafer W. This ring-shaped groove 240 is communicated with a passage 241, which is also communicated with a capacitance manometer 264 through a pipe 266.

The capacitance manometer 264 cooperates with a mass flow controller (MFC) 263 to control the pressure of gas introduced from gas supply sources 251 and 252 into the ring-shaped groove 240. A gas mixer (buffer tank) 269 is mounted on the upstream side of the capacitance manometer 264 so that two or more kinds of gases can be mixed in the tank 269. In short, both of the capacitance manometer 264 and the MFC 263 are controlled by a controller 270 to accurately control the pressure of gas introduced to an order of point several Torr. A valve 262 is arranged in the gas supply pipe 261 upstream the MFC 263. A chuck valve 265 as attached to the drain of the capacitance manometer 264. It is desirable that the lower electrode 212 is coated with insulating material except the wafer mount thereof. When it is coated in this manner, the focus effect of concentrating discharge on the wafer can be enhanced.

The lower electrode 212 is moved up and down at a stroke of 30 mm, maximum, by a lifter 213. While it is being moved up and down, the chamber 211 can be kept air-tight by a bellows 214 made of stainless steel.

A hollow portion 212a is formed in the lower electrode 212. Plural (or four) through-holes run in the ceiling of the hollow portion 212a, extending from the hollow portion 212a to the top of the lower electrode 212, and a lifter pin 216 made of stainless steel passes through each throughhole. These lifter pins 216 are connected to a lifter mechanism 218 via a plate 217. When the lifter mechanism 218 is made operative, the lifter pins 216 are lifted and when the lifter pins 216 are lifted in this manner, the wafer w is released from the top of the lower electrode 212. The wafer W is thus made ready for being carried out of the chamber 211. When the lifter pins 216 are lowered, the wafer W is mounted on the lower electrode 212. A coil spring 219 is arranged between the lower electrode 212 and the plate 217 to smoothly move the lifter pins 216.

A clamp ring 220 is arranged above the lower electrode 212 and it serves to uniformly push and fix the wafer W against the top of the lower electrode 212. Its center portion is shaped to match the wafer mount of the lower electrode 212. It is made of aluminium whose surface has been anodic-oxidation-processed, quartz or ceramics such as alumina not to add any influence to plasma.

The clamp ring 220 is supported by plural (or four) shafts 221 which air-tightly passes through the top of the chamber 211. Each shaft 221 is connected to its individual air cylinder 222. When the lower electrode 212 is moved up while holding the wafer W thereon, the wafer W is struck against the clamp ring 220 and when it is further moved up, the wafer W is clamped by the clamp ring 220 due to force added by the air cylinders 222. When a drive source 272 for the air cylinders 222 is controlled, the clamp ring 220 can be moved up by a certain distance or 5 mm, for example, while adding force needed to the clamp ring 220.

A conductive member 223 is arranged in the top of the chamber 211. It is made of conductive material such as aluminium whose surface has been anodic-oxidation-processed. An upper electrode 224 which is electrically connected to it is arranged under it with a clearance 225 interposed between them. The upper electrode 224 is made of amorphous carbon, aluminium or aluminium whose surface has been anodic-oxidation-processed.

One end of a gas supply pipe 226 is communicated with the clearance 225. The other end thereof is communicated with the first gas supply source 251, in which process gas is stored. A valve 257 and an MFC 258 are arranged in a supply pipe 256. It may be arranged that nitrogen gas is introduced from another bomb (not shown) into the supply pipe 256 and that this nitrogen gas introduced is mixed with process gas.

The second gas supply source 252 is communicated with the ring-shaped groove 240 in the top of the lower electrode 212 through the supply pipes 261, 266 and the passage 241. Auxiliary gas is stored in the second gas supply source 252. The first and second gas supply sources 251 and 252 are communicated with each other through a valve 255. Further, valves 253 and 254 are attached to their respective bombs 251 and 252 which are primarily decompressed by these valves 253 and 254.

It may be arranged that a tape heater (not shown) is wound round the gas supply pipe 266 to pre-heat auxiliary gas and that a cooling unit (not shown) is attached to the pipe 266 to pre-cool auxiliary gas. In this case, it is necessary to make the auxiliary gas pass through a gas dryer (not shown) to lower a dew-point temperature of the gas. While pre-heating or -cooling auxiliary gas, the temperature of auxiliary gas can be adjusted to correspond to the temperature of the wafer W.

Plural baffles 227 each having a plurality of apertures to uniformly scatter gas are arranged in the clearance 225. The upper electrode 224 has plural holes 228 to introduce the gas thus scattered into the chamber 211 through them.

A sealed ring 229 made of insulating material such as teflon is attached to the peripheral portion of the upper electrode 224. Plasma having same diameter as that of the wafer W can be thus generated.

A high frequency power source 230 is connected to the upper electrode 224 via a capacitor 231 and the conductive member 223, and the lower electrode 212 is earthed. When high frequency current is supplied from the power source 230 between the electrodes 212 and 224, gas plasma is generated between them. The plasma thus generated is for radical etching.

When the lower electrode 212 is used as high voltage one and the upper electrode 224 is earthed, plasma for reactive ion etching (RIE) can be generated. Further, RF current, different in phase by 180 degrees, can be supplied between the upper and the lower electrode. Still further, etching of the magnetron etching type may be carried out by arranging a magnet above or round the chamber 211 to form orthogonal electromagnetic field between the upper and the lower electrode. When the magnet is used in this manner, etching process can be conducted under low pressure with high efficiency.

A gas exhausting port 235 is formed in the lower portion of a side wall of the chamber 211. The chamber 211 can be exhausted through the port 235 by a vacuum pump (not shown).

Wafer carrying-in and -out openings 232 and 233 are formed in two opposite side walls of the chamber 211. Load lock chambers (not shown) are continuous from these openings 232 and 233.

Figure 12:
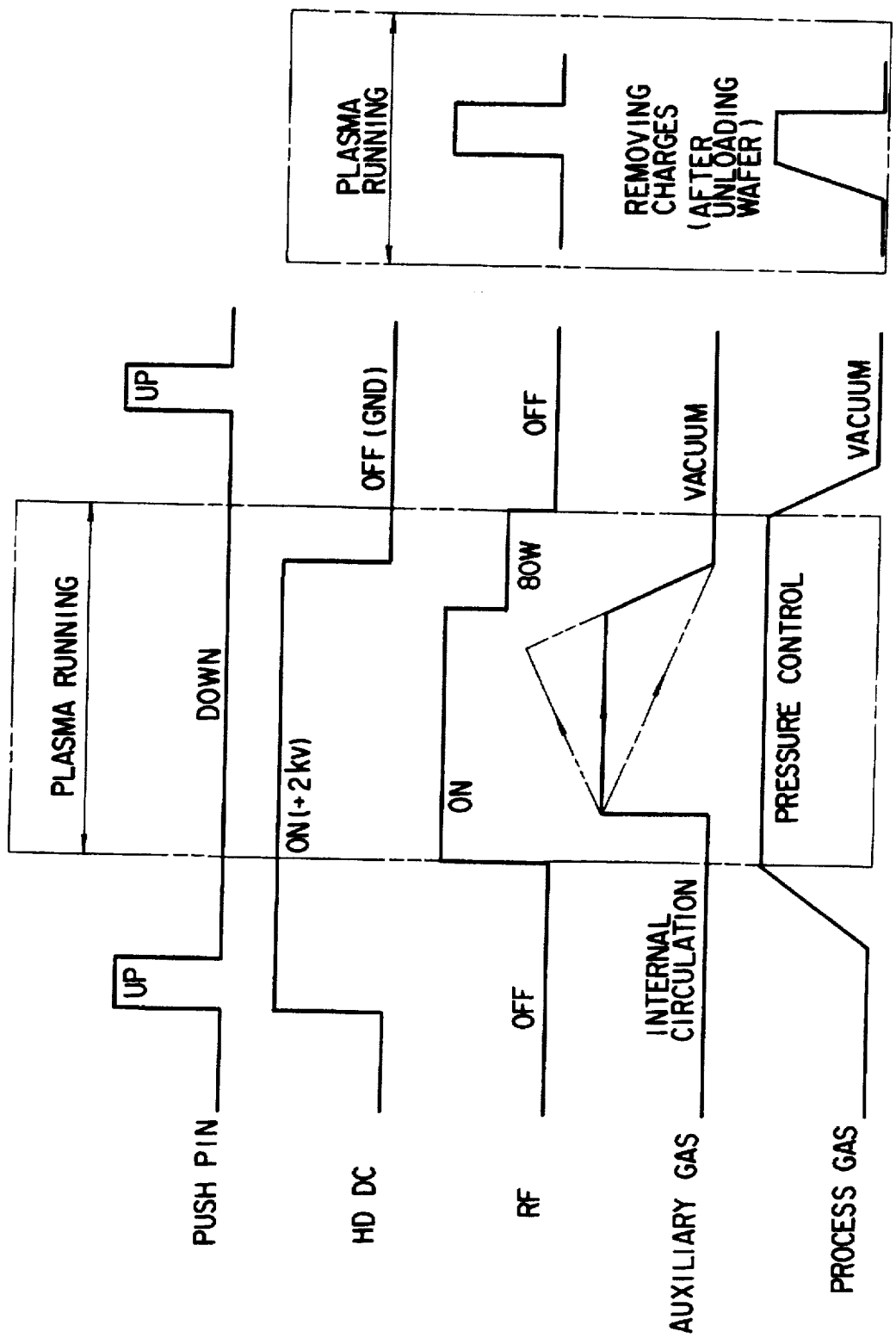
FIG. 12 is a timing chart showing the progress of plasma etching process.

Referring to FIG. 12, it will be described how a silicon wafer W is plasma-etched by the above-described etching apparatus.

A sheet of wafer W is picked up by a sender (not shown) and carried into the load lock chamber. The inlet gate of the load lock chamber is closed and the load lock chamber is exhausted. The outlet gate is then opened and the wafer W is carried into the chamber 211 and above the lower electrode 212. The lifter pins 216 are moved up to receive the wafer W on their tops and the chamber 211 is then made air-tight. They are moved down to mount the wafer W on the lower electrode 212. The lower electrode 212 is moved up to strike the wafer w against the clamp ring 220. The wafer W is thus fixed by the clamp ring 220.

While exhausting the chamber 211, process gas is introduced from the first gas supply source 251 into the upper clearance 225 at a predetermined flow rate and internal pressure in the chamber 211 is made lower than 1 Torr.

After the internal pressure in the chamber 211 becomes stable, RF current is supplied between the upper 224 and the lower electrode 212 to generate process gas plasma between them. This gas plasma is reacted with oxide film on the wafer W and the oxide film is thus etched. The oxide film thus etched is $SiO_2$ film, for example, formed on the wafer W by CVD. $SiO_2$ interlayer insulating film of 2,000 Å to 20,000 Å is usually formed on a MOS silicon wafer.

The auxiliary gas is subjected in advance to an internal circulation inside the tank 269 and the capacitance manometer 264, thereby enabling the auxiliary gas to rapidly respond to the pressure when supplied to the groove 240.

While generating plasma, auxiliary gas is introduced from the second gas supply source 252 into the ring-shaped groove 240 under a predetermined pressure. The pressure of gas thus introduced is controlled with high accuracy. It may be kept certain or it may be increased or decreased during the etching process. The supply of auxiliary gas may be continuous or intermittent.

Auxiliary gas flows from the ring-shaped groove 240 into the clearance between the wafer W and the lower electrode 212 and a part of it leaks into process atmosphere in the chamber 211. This gas leaked serves to promote etching in the peripheral portion of the wafer W. The unevenness of etching in the plane of the wafer W can be thus reduced. In other words, the oxide film etching uniformity in the plane of the wafer w can be enhanced.

The ring-shaped groove 240 is optional in the present invention and is preferably mounted therein because the groove 240 contributes to uniformity of the temperature of the wafer surface. It is, however, preferable that the width of the groove is in a range of 1 to 15 mm, most preferably 4±0.5 mm. When viewing the groove 240 horizontally sectioned, it may be shaped like a U, V, rectangle or semi-circle.

It is needed that the amount of auxiliary gas leaked is controlled while controlling the clamping force of the clamp ring 220 relative to the wafer W with high accuracy. It is desirable that this clamping force is in a range of 1 to 8 $kg/cm^2$ and it is most desirable that the clamping force is micro-adjusted to a range of 3±1 $kg/cm^2$.

When plasma etching is to be carried out under the above-described conditions, any of the above-mentioned gases in which oxygen or nitrogen is included may be added to plasma gas at the same time the etching is started. It may be arranged, however, that the etching is conducted while supplying only halogen-element-contained-gas to plasma gas until the etching advances near to the layer of $SiO_2$ film on the wafer W and that oxygen or nitrogen is then added to process gas.

When the etching process is finished, the lower electrode 212 is lowered while exhausting the chamber 211. The lifter pins 216 are moved up to receive the wafer W on their tops and the wafer W on them is then picked up and carried out of the chamber 211 by a carry-out mechanism (not shown). After the wafer W is carried out of the chamber 211, RF power source is turned on to generate plasma in the chamber 211 in which no wafer is present. Static electricity remaining on the lower electrode 212 is thus removed. Then, the etching process will be repeated again relative to a next wafer in the same manner.

It is preferable that halogen-element-contained gas is used as auxiliary gas. Any gas can be used if it contains halogen element. It is preferable, however, that one of $Cl_2$, HBr, HCl, HI, $SF_6$ and $CF_4$ is used or two or more of them are mixed.

It is more preferable that two or more of them are mixed from the viewpoint of controlling the shape of etching and also reducing matters created at the etching.

Any gas can be used as additional gas if it contains oxygen or nitrogen. It is preferable, however, that $O_2$, $N_2O$, $CO_2$, CO, $N_2$ or $NO_2$ is used.

It is preferable that the rate of oxygen or nitrogen in process gas is smaller than 10% when represented by flow rate. The above-mentioned effect can be expected if the process gas includes quite a little of oxygen or nitrogen, but when the rate becomes larger than 10%, etching speed is made low. It is therefore more preferable that the rate of oxygen or nitrogen is in a range of 1 to 4.5%.

Figure 13:
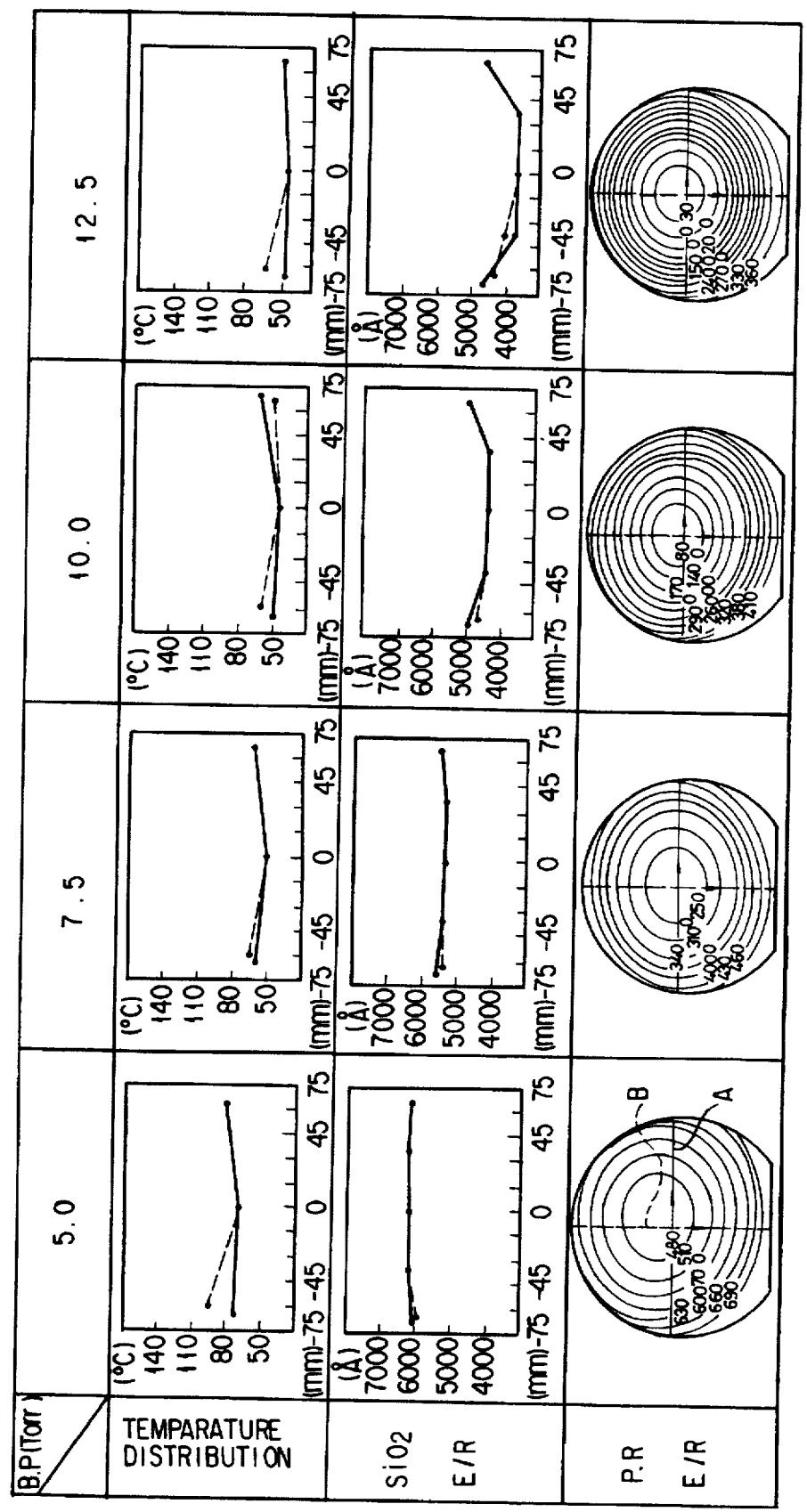
FIG. 13 are characteristic lines showing wafer temperature and etching rate distributions obtained when a lower electrode provided with a groove, 4 mm wide, is used and $CF_4$ is used as auxiliary gas.

Referring to FIG. 13, a first test example will be described. The layer of $SiO_2$ film on a 6-inch silicon wafer was etched by the above-described etching apparatus in this case. Etching conditions were as follows;

Chamber internal pressure: 500 mTorr
RF voltage: 800 W (frequency; 13.56 MHz)
Distance between the upper and the lower electrode: 10 mm
Shower diameter: 150 mm
T & B:7:3
Process gas: $CHF_3$ gas 40 SCCM/$CF_4$ gas 40 SCCM/Ar gas 800 SCCM
Auxiliary gas: $CF_4$ gas 2.9 SCCM (constant)
Clamping force: 3 kg/$c^2$ (constant pressure of air supplied to the cylinder)
Back pressure of auxiliary gas: 5 Torr, 7.5 Torr, 10 Torr, 12.5 Torr
Width of ring-shaped groove: 4 mm
Lower temperature: $-10°$ C.
Upper temperature: $+20°$ C.
Side wall: $+40°$ C.

As shown in FIG. 13, results obtained were as follows when the back pressure of auxiliary gas was 5 Torr;
Temperature distribution: 79° C.±16.9%
$SiO_2$ etching rate: 6125 Å±1.8%
P.R etching rate: $-690$ Å(peripheral portion)—+480 Å(center portion).

The etching rates were results (which were shown by solid lines in FIG. 13) obtained when measured in a direction running through the center of the wafer and parallel to the orientation flat thereof, and results (which were shown by broken lines) obtained when measured in a direction perpendicular to the above direction.

when the back pressure of auxiliary gas was 7.5 Torr, results obtained were as follows;
Temperature distribution: 61° C.±14.4%
$SiO_2$ etching rate: 5491 Å±2.2%
P.R etching rate: $-490$ Å (peripheral portion)—+250 Å(center portion).

Results obtained were as follows when the back pressure of auxiliary gas was 10 Torr;
Temperature distribution: 54° C.±15.9%
$SiO_2$ etching rate: 4677 Å±7.2% P.R etching rate: $-440$ Å (peripheral portion)—80 Å(center portion).

Results obtained were as follows when the back pressure of auxiliary gas was 12.5 Torr;
Temperature distribution: 47° C.±21.6% $SiO_2$ etching rate: 4056 Å±13.0%
P.R etching rate: $-390$ Å (peripheral portion)—80 Å (center portion).

Figure 14:
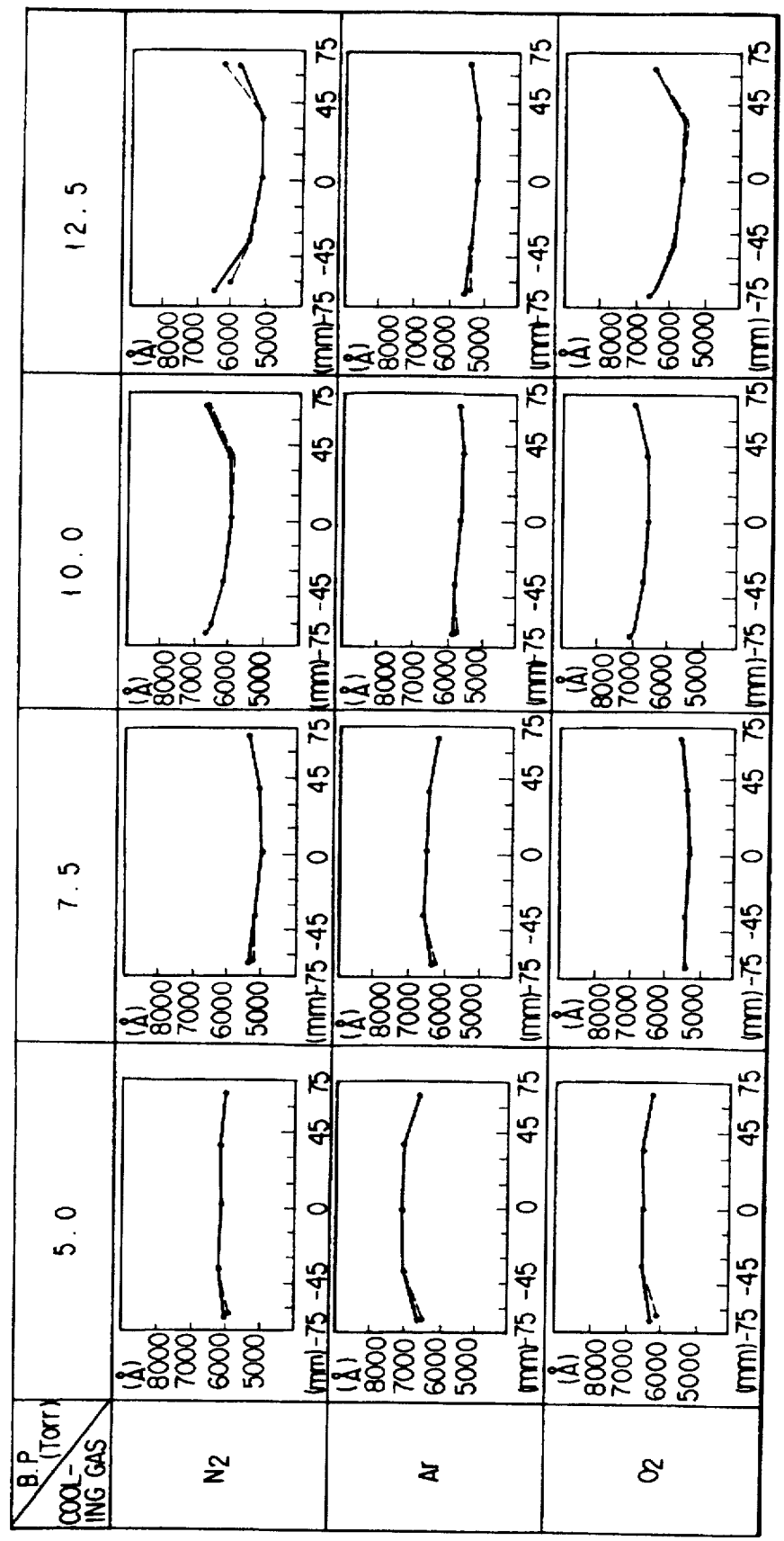
FIG. 14 shows etching rate distributions when viewing the wafer horizontally sectioned, these distributions being obtained when the lower electrode provided with the groove, 4 mm wide, is used and $N_2$, Ar and $O_2$ gases are used as auxiliary gas, respectively.
Figure 15:
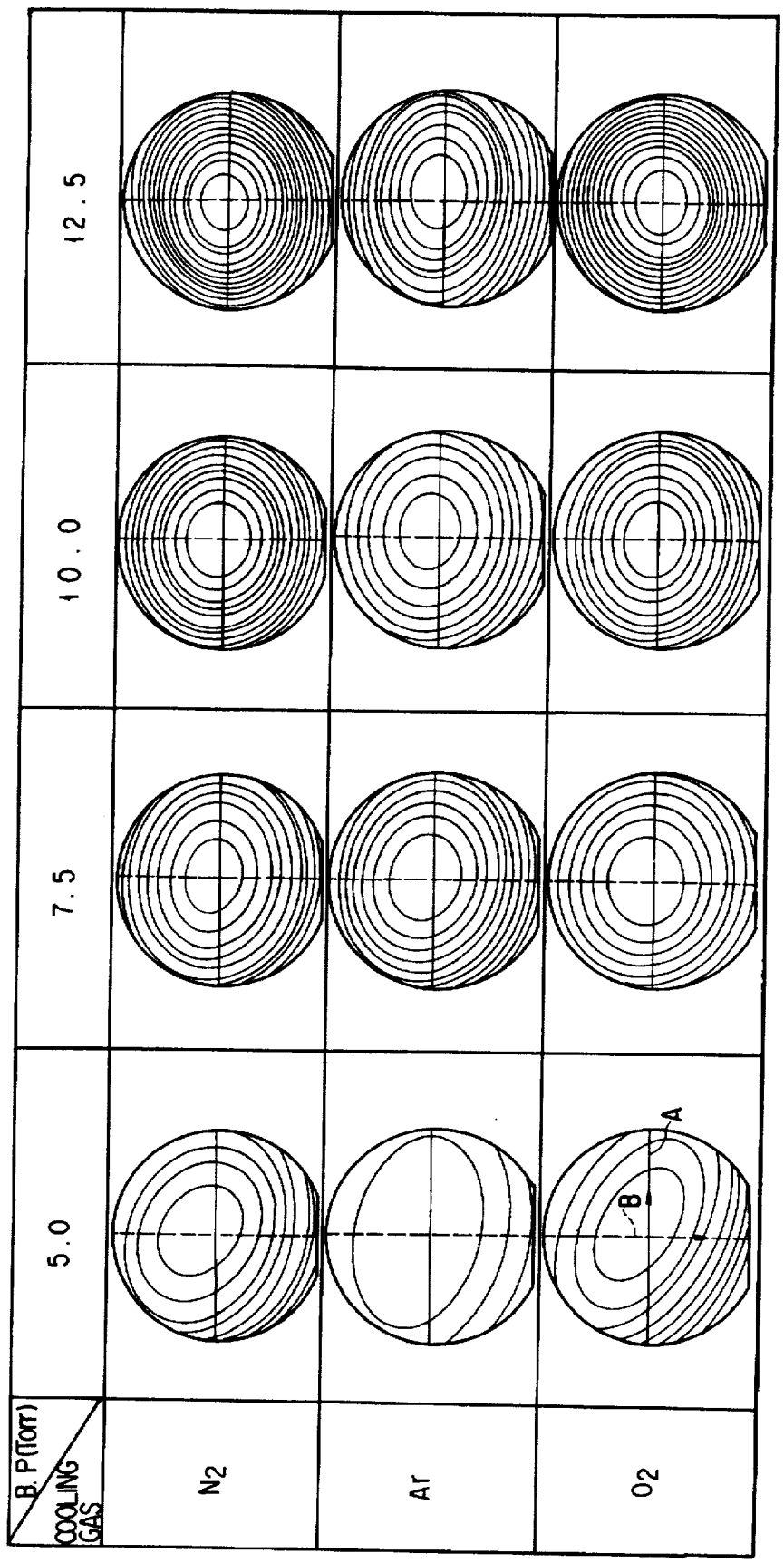
FIG. 15 shows etching rate distributions when viewing the wafer in a plane, these distributions being obtained when the lower electrode provided with the groove, 4 mm wide, is used and $N_2$, Ar and $O_2$ gases are used as auxiliary gas, respectively.

Referring to FIGS. 14 and 15, a second test example will be described. The layer of $SiO_2$ film on 6-inch silicon wafer was etched by the above-described etching apparatus in this case. Conditions were same as those in the first test example except when shown below. The following four gases were used auxiliary gas;
Auxiliary gas: nitrogen gas 5 SCCM (constant)
argon gas 5 SCCM (constant)
oxygen gas 5 SCCM (constant)
helium gas 5 SCCM (constant).

As shown in FIG. 14, results obtained were as follows when the back pressure of auxiliary gas was 5 Torr;

| Kind of gas | $SiO_2$ etching rate |
| --- | --- |
| Nitrogen gas | 6072Å ± 2.3% |
| Argon gas | 6735Å ± 4.2% |
| Oxygen gas | 6360Å ± 3.1% |

Results obtained were as follows when the back pressure of auxiliary gas was 7.5 Torr;

| Kind of gas | $SiO_2$ etching rate |
| --- | --- |
| Nitrogen gas | 5218Å ± 3.5% |
| Argon gas | 6235Å ± 3.1% |
| Oxygen gas | 5428Å ± 2.3% |

Results obtained were as follows when the back pressure of auxiliary gas was 10 Torr;

| Kind of gas | $SiO_2$ etching rate |
| --- | --- |
| Nitrogen gas | 4292Å ± 10.7% |
| Argon gas | 5694Å ± 1.7% |
| Oxygen gas | 4767Å ± 5.8% |

Results obtained were as follows when the back pressure of auxiliary gas was 12.5 Torr;

| Kind of gas | $SiO_2$ etching rate |
| --- | --- |
| Nitrogen gas | 3688Å ± 18.0% |
| Argon gas | 5279Å ± 3.9% |
| Oxygen gas | 4075Å ± 12.9% |

As shown in FIG. 15, results obtained were as follows when the back pressure of auxiliary gas was 5 Torr;

| Kind of gas | P.R etching rate |
| --- | --- |
| Nitrogen gas | 581Å ± 15.6% |
| Argon gas | 911Å ± 4.3% |
| Oxygen gas | 613Å ± 20.2% |
| Helium gas | 958Å ± 9.9% |

Results obtained were as follows when the back pressure of auxiliary gas was 7.5 Torr;

| Kind of gas | P.R etching rate |
| --- | --- |
| Nitrogen gas | 321Å ± 31.7% |
| Argon gas | 553Å ± 18.7% |
| Oxygen gas | 297Å ± 30.4% |
| Helium gas | 562Å ± 13.7% |

Results obtained were as follows when the back pressure of auxiliary gas was 10 Torr;

| Kind of gas | P.R etching rate |
| --- | --- |
| Nitrogen gas | 145Å ± 88.3% |
| Argon gas | 397Å ± 24.4% |
| Oxygen gas | 207Å ± 51.1% |
| Helium gas | 373Å ± 21.3% |

Results obtained were as follows when the back pressure of auxiliary gas was 12.5 Torr;

| Kind of gas | P.R etching rate |
| --- | --- |
| Nitrogen gas | Deposited in the center portion of the wafer |
| Argon gas | 337Å ± 49.7% |
| Oxygen gas | Deposited in the center portion of the wafer |
| Helium gas | 225Å ± 41.2% |

As apparent from the above-described second test example, the uniformity of P.R etching rate in a plane of the wafer is better in the case of helium and argon gases than in the case of nitrogen and oxygen gases, providing that the back pressure of auxiliary gas is same. However, no difference exists between both of them, as compared with them at same E/R.

A third test example will be described with reference to FIGS. 16 through 19.

The layer of $SiO_2$ film on a 6-inch silicon wafer was etched by the above-described etching apparatus in this case. Conditions were same as those in the first test example except when shown below. E/R was checked using helium gas (flow rate: 5 SCCM) as auxiliary gas and the following four lower electrodes while changing clamping force from 3 $kg/cm^2$ to 4 $kg/cm^2$ and 5 $kg/cm^2$.

Figure 16:
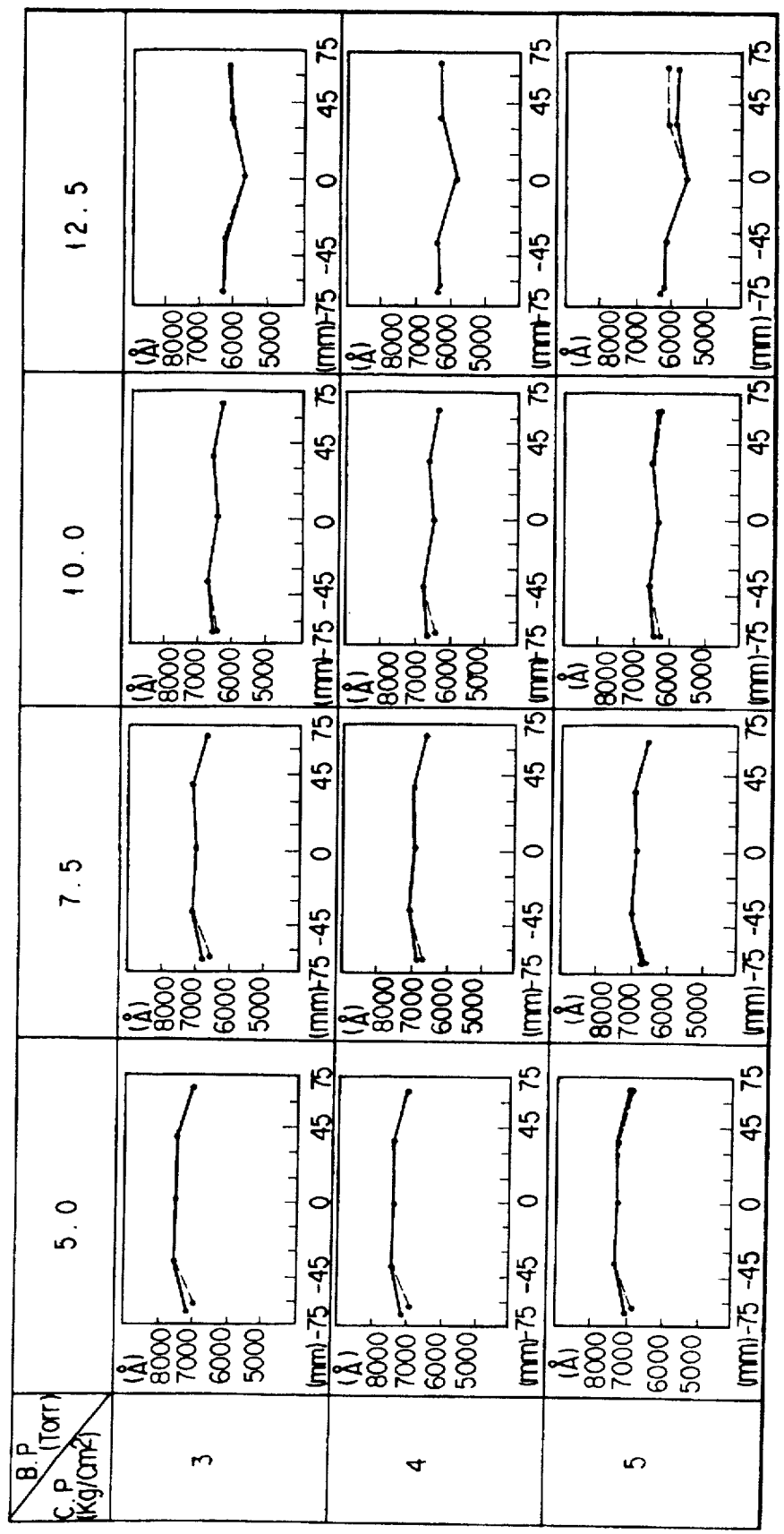
FIG. 16 shows etching rate distributions when viewing the wafer horizontally sectioned, these distributions being obtained when the lower electrode of the normal type is used and He gas is used as auxiliary one.
Figure 17:
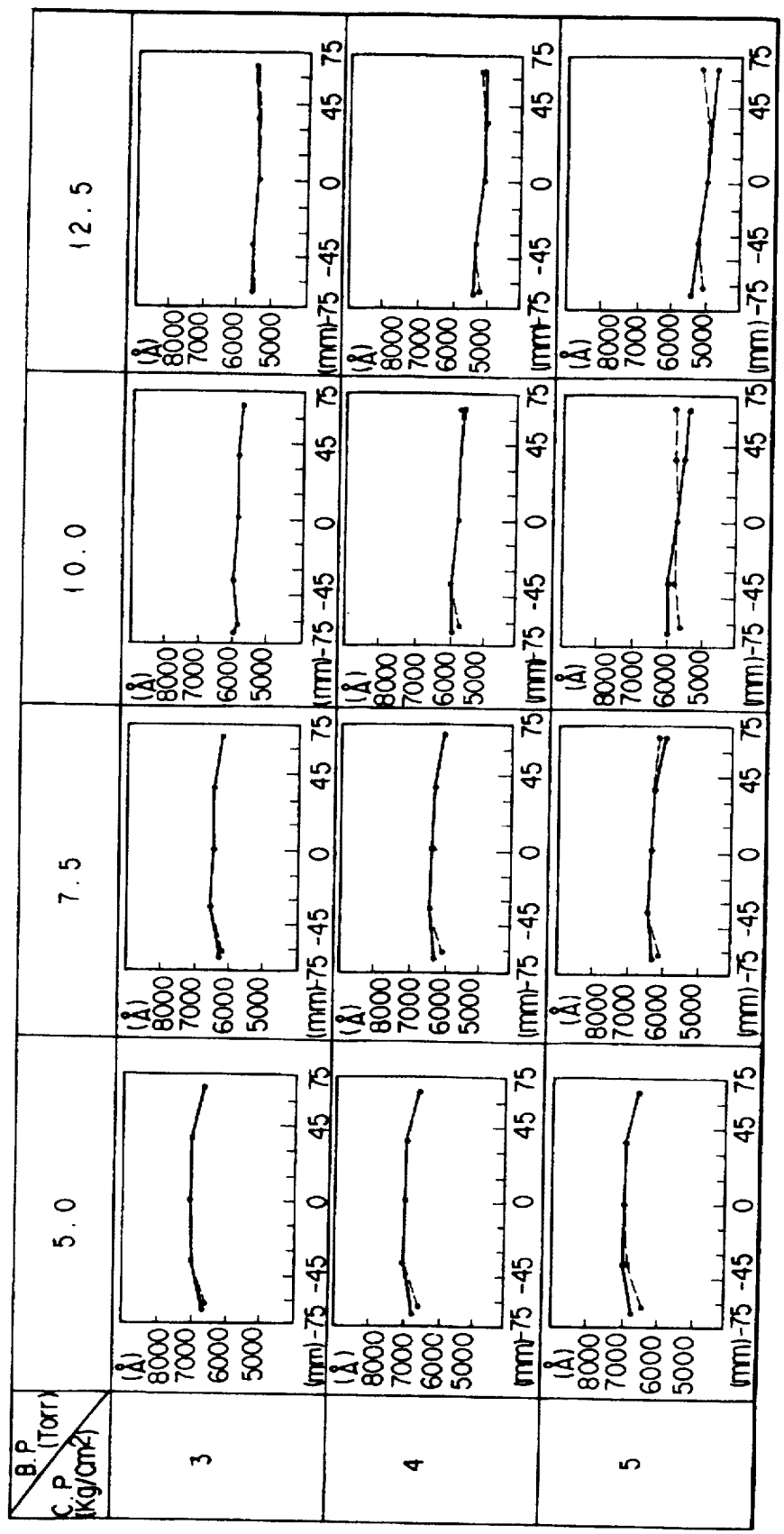
FIG. 17 shows etching rate distributions when viewing the wafer horizontally sectioned, these distributions being obtained when the lower electrode having the groove, 4 mm wide, is used and He gas is used as auxiliary one.
Figure 18:
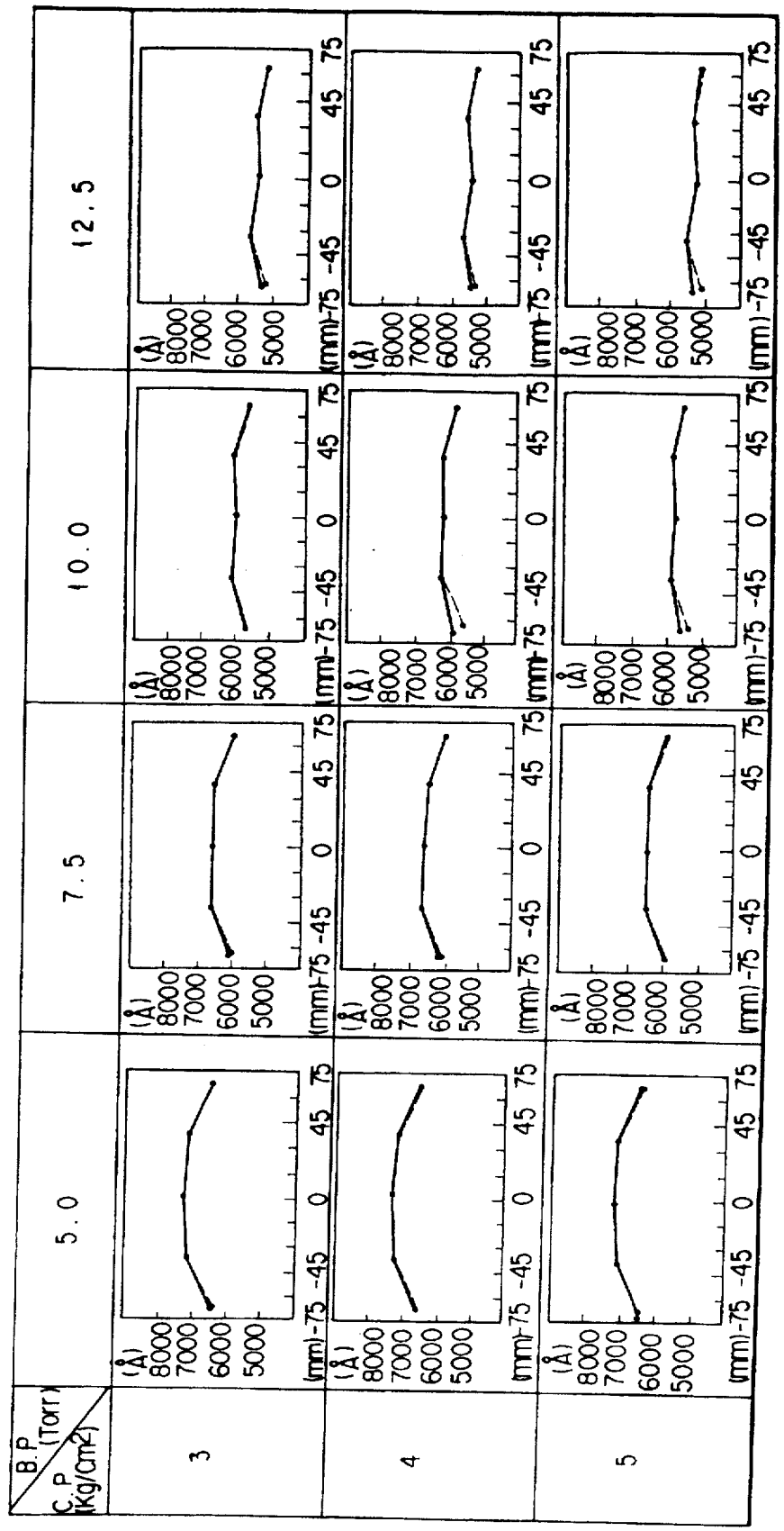
FIG. 18 shows etching rate distributions when viewing the wafer horizontally sectioned, these distributions being obtained when the lower electrode having a groove, 10 mm wide, is used and He gas is used as auxiliary one.
Figure 19:
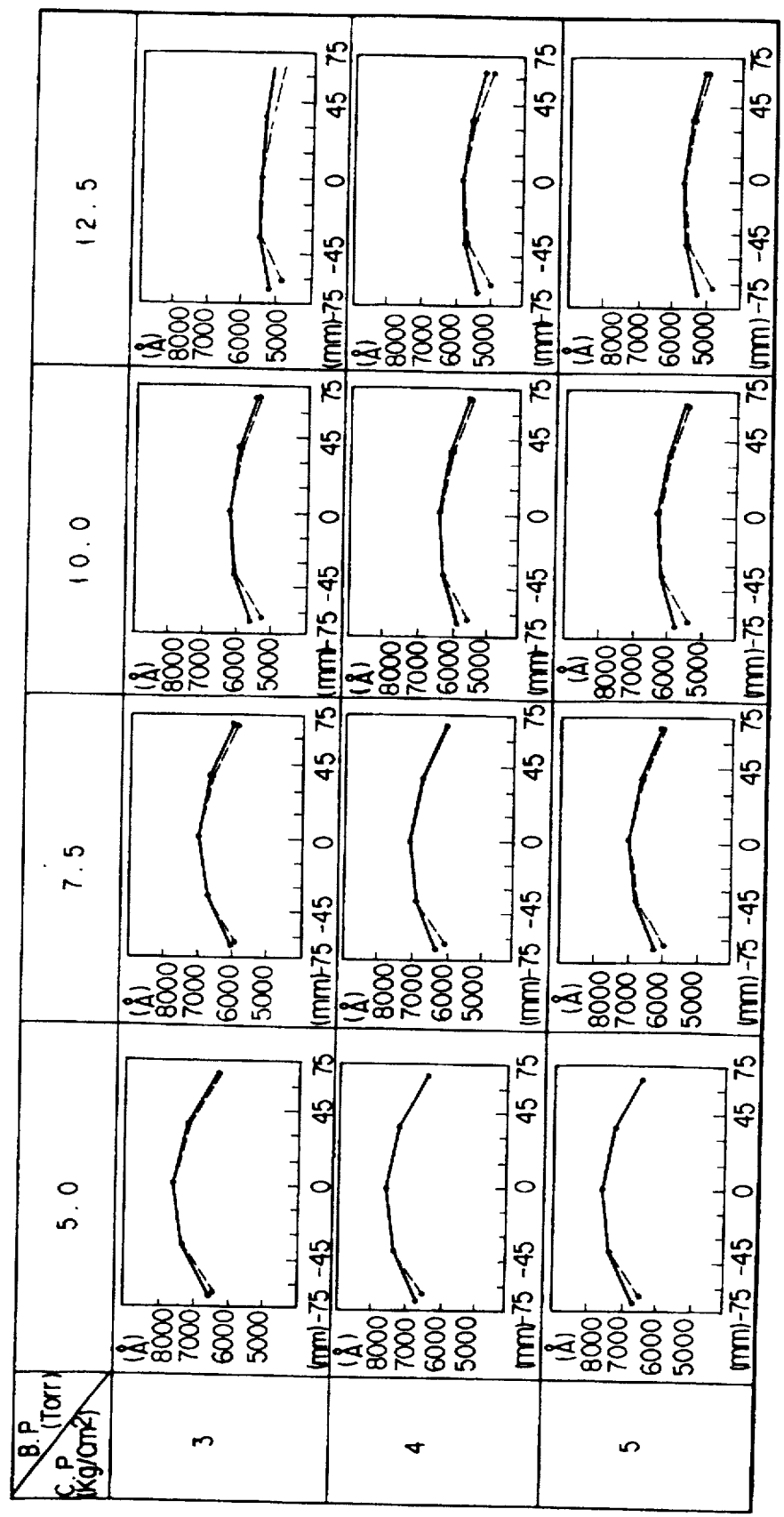
FIG. 19 shows etching rate distributions when viewing the wafer horizontally sectioned, these distributions being obtained when the lower electrode having a groove, 15 mm wide, is used and He gas is used as auxiliary one.

FIG. 16 shows results obtained when the lower electrode of the normal type (having no groove) was used, FIG. 17 shows results obtained when the lower electrode having a groove, 4 mm wide, was used, FIG. 18 shows results obtained when the lower electrode having a groove, 10 mm wide, was used, and FIG. 19 shows results obtained when the lower electrode having a groove, 15 mm wide, was used.

As shown in FIG. 16, results obtained were as follows when the back pressure of auxiliary gas was 5 Torr (lower electrode: normal type having no groove);

| Clamping force | $SiO_2$ etching rate |
| --- | --- |
| 3 $kg/cm^2$ | 7258Å ± 4.0% |
| 4 $kg/cm^2$ | 7138Å ± 3.8% |
| 5 $kg/cm^2$ | 7174Å ± 4.0% |

Results obtained were as follows when the back pressure of auxiliary gas was 7.5 Torr;

| Clamping force | $SiO_2$ etching rate |
| --- | --- |
| 3 $kg/cm^2$ | 6892Å ± 3.9% |
| 4 $kg/cm^2$ | 6861Å ± 3.7% |
| 5 $kg/cm^2$ | 6822Å ± 3.1% |

Results obtained were as follows when the back pressure of auxiliary gas was 10 Torr;

| Clamping force | $SiO_2$ etching rate |
| --- | --- |
| 3 $kg/cm^2$ | 6536Å ± 3.1% |
| 4 $kg/cm^2$ | 6592Å ± 3.2% |
| 5 $kg/cm^2$ | 6442Å ± 2.7% |

Results obtained were as follows when the back pressure of auxiliary gas was 12.5 Torr;

| Clamping force | $SiO_2$ etching rate |
| --- | --- |
| 3 $kg/cm^2$ | 6140Å ± 5.8% |
| 4 $kg/cm^2$ | 6215Å ± 5.2% |
| 5 $kg/cm^2$ | 6033Å ± 5.9% |

As shown in FIG. 17, results obtained were as follows when the back pressure of auxiliary gas gas 5 Torr (lower electrode: having a groove, 4 mm wide);

| Clamping force | $SiO_2$ etching rate |
| --- | --- |
| 3 $kg/cm^2$ | 6859Å ± 3.6% |
| 4 $kg/cm^2$ | 6809Å ± 3.3% |
| 5 $kg/cm^2$ | 6774Å ± 4.2% |

Results obtained were as follows when the back pressure of auxiliary gas was 7.5 Torr;

| Clamping force | $SiO_2$ etching rate |
| --- | --- |
| 3 $kg/cm^2$ | 6375Å ± 2.8% |
| 4 $kg/cm^2$ | 6290Å ± 3.2% |
| 5 $kg/cm^2$ | 6247Å ± 4.0% |

Results obtained were as follows when the back pressure of auxiliary gas was 10 Torr;

| Clamping force | $SiO_2$ etching rate |
| --- | --- |
| 3 $kg/cm^2$ | 5875Å ± 2.2% |
| 4 $kg/cm^2$ | 5810Å ± 3.0% |
| 5 $kg/cm^2$ | 5709Å ± 4.9% |

Results obtained were as follows when the back pressure of auxiliary gas was 12.5 Torr;

| Clamping force | $SiO_2$ etching rate |
| --- | --- |
| 3 $kg/cm^2$ | 5508Å ± 1.8% |
| 4 $kg/cm^2$ | 5223Å ± 4.0% |
| 5 $kg/cm^2$ | 5080Å ± 6.4% |

As shown in FIG. 18, results obtained were as follows when the back pressure of auxiliary gas was 5 Torr (lower electrode: having a groove, 10 mm wide);

| Clamping force | $SiO_2$ etching rate |
| --- | --- |
| 3 $kg/cm^2$ | 6914Å ± 6.3% |
| 4 $kg/cm^2$ | 6889Å ± 6.4% |
| 5 $kg/cm^2$ | 6874Å ± 5.5% |

Results obtained were as follows when the back pressure of auxiliary gas was 7.5 Torr;

| Clamping force | SiO₂ etching rate |
| --- | --- |
| 3 kg/cm² | 6376Å ± 5.0% |
| 4 kg/cm² | 6359Å ± 5.0% |
| 5 kg/cm² | 6252Å ± 4.8% |

Results obtained were as follows when the back pressure of auxiliary gas was 10 Torr;

| Clamping force | SiO₂ etching rate |
| --- | --- |
| 3 kg/cm² | 5912Å ± 4.7% |
| 4 kg/cm² | 5994Å ± 5.4% |
| 5 kg/cm² | 5751Å ± 4.0% |

Results obtained were as follows when the back pressure of auxiliary gas was 12.5 Torr;

| Clamping force | SiO₂ etching rate |
| --- | --- |
| 3 kg/cm² | 5518Å ± 4.5% |
| 4 kg/cm² | 5444Å ± 4.2% |
| 5 kg/cm² | 5292Å ± 3.8% |

As shown in FIG. 19, results obtained were as follows when the back pressure of auxiliary gas was 5 Torr (lower electrode: having a groove, 15 mm wide);

| Clamping force | SiO₂ etching rate |
| --- | --- |
| 3 kg/cm² | 6953Å ± 8.9% |
| 4 kg/cm² | 6966Å ± 8.4% |
| 5 kg/cm² | 6972Å ± 7.8% |

Results obtained were as follows when the back pressure of auxiliary gas was 7.5 Torr;

| Clamping force | SiO₂ etching rate |
| --- | --- |
| 3 kg/cm² | 6451Å ± 8.0% |
| 4 kg/cm² | 6444Å ± 7.9% |
| 5 kg/cm² | 6382Å ± 7.9% |

Results obtained were as follows when the back pressure of auxiliary gas was 10 Torr;

| Clamping force | SiO₂ etching rate |
| --- | --- |
| 3 kg/cm² | 5888Å ± 8.0% |
| 4 kg/cm² | 5880Å ± 7.4% |
| 5 kg/cm² | 5854Å ± 7.6% |

Results obtained were as follows when the back pressure of auxiliary gas was 12.5 Torr;

| Clamping force | SiO₂ etching rate |
| --- | --- |
| 3 kg/cm² | 5259Å ± 6.4% |
| 4 kg/cm² | 5371Å ± 7.4% |
| 5 kg/cm² | 5401Å ± 8.1% |

Although the wafer has been held on the lower electrode by the clamp ring in the above-described examples, the present invention is not limited to this case but it can be applied even to a case where the wafer is held on the lower electrode by the electrostatic chuck. It is desirable in this case that voltage added to the electrostatic chuck is in a range of 1 to 3 kV, most desirably in a range of 2±0.1 kV. This voltage added is determined, depending upon the internal pressure in the chamber, the pressure of auxiliary gas introduced, the charging up of the wafer and the lower electrode, and so on.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of etching a film formed on a surface of a semiconductor wafer, comprising:

providing a first gas source and a second gas source, which both communicate with a chamber, and a valve arranged on a passageway communicating said first gas source and said second gas source;

holding a wafer on a lower electrode in the chamber by holder means such that the wafer faces an upper electrode;

exhausting the chamber to reduce an inner pressure of the chamber;

forming an electric field under reduced pressure between the wafer and the upper electrode while supplying a process gas from said first gas source through the upper electrode toward the wafer to form a gas plasma of the process gas; and simultaneously introducing an auxiliary gas differing in composition from the process gas, from said second gas source by closing said valve, or from both said first and second gas sources by opening said valve, into a micro-clearance between the wafer and the lower electrode and allowing said auxiliary gas to leak into the chamber through said micro-clearance, while the gas plasma of the process gas is acting on the wafer thereby allowing an etching reaction performed by the gas plasma of the process gas in a peripheral portion of the wafer to be controlled by the auxiliary gas;

wherein 1) the process gas comprises a gas not present in the auxiliary gas of the auxiliary gas comprises a gas not present in the process gas or 2) the auxiliary gas comprises a gas not present in the process gas and the process gas comprises a gas not present in the auxiliary gas.

2. The etching method according to claim 1, wherein internal pressure in the chamber is made lower than 1 Torr and the pressure of the auxiliary gas introduced into the micro-clearance between the wafer and the lower electrode is controlled to be in a range of 3 to 20 Torr.

3. The etching method according to claim 2, wherein the pressure of the auxiliary gas introduced is kept constant.

4. The etching method according to claim 2, wherein the pressure of the auxiliary gas introduced is increased and decreased.

5. The etching method according to claim 1, wherein a groove is formed in the top of the lower electrode and the auxiliary gas is introduced into this groove of the lower electrode.

6. The etching method according to claim 1, wherein the introduction of the auxiliary gas is intermittent.

7. The etching method according to claim 1, wherein the auxiliary gas is pre-heated or -cooled to match the temperature of the wafer.

8. The etching method according to claim 1, wherein an amount of the auxiliary gas leaked from the micro-clearance into the chamber is controlled to be in a range of 0.1 to 50 SCCM.

9. The etching method according to claim 1, wherein a clamp ring is used as holder means and the wafer clamping force of it is controlled to be in a range of 1 to 8 kg/cm$^2$.

10. The etching method according to claim 1, wherein said auxiliary gas contains a halogen element and at least one member selected from the group consisting of a second halogen element, carbon, hydrogen, boron, nitrogen, sulfur, phosphorus and oxygen.

11. The etching method according to claim 1, wherein said auxiliary gas is a member selected from the group consisting of saturated carbon fluorides, saturated carbon chlorides, saturated carbon bromides, saturated carbon iodides, saturated mixed carbon halides, unsaturated mixed carbon halides, saturated mixed hydrocarbons, unsaturated mixed hydrocarbons unsaturated carbon halides, saturated cyclic carbon halides, unsaturated cyclic carbon halides, halogen gas, interhalogen compounds, hydrogen halides, boron halides, boron hydrides, halogenoborohydrides, nitrogen halides, sulfur halides, silane halides and phosphine halides.

12. The etching method according to claim 1, wherein said auxiliary gas is a member selected from the group consisting of HCl, HBr, HI, SF$_6$, CF$_4$, F$_2$, Cl$_2$, Br$_2$, I$_2$, At$_2$, Cl$_3$F, ICl$_3$, ClF, ICl, BrF, BrF$_3$, BrF$_5$, IF$_5$, IF$_7$, CBrF$_3$, CFBr$_3$, C$_2$ClF$_5$, CClF$_3$, C$_2$BrF$_3$, C$_2$FCl$_3$, CHF$_3$, CHBrF$_2$, CHBr$_3$, CH$_2$Br$_2$, CHCl$_3$, C$_2$HF$_2$Br$_3$, C$_2$HFCl$_3$, C$_2$H$_2$FCl, C$_2$F$_4$, C$_3$F$_6$, C$_4$F$_8$, C$_2$F$_2$, C$_3$F$_4$, C$_4$F$_6$, PCl$_3$, PCl$_5$ and P$_2$Cl$_4$.

13. The etching method according to claim 1, wherein said auxiliary gas is a member selected from the group consisting of saturated hydrocarbons, unsaturated hydrocarbons, saturated cyclic hydrocarbons, unsaturated cyclic hydrocarbons and aromatic compounds.

14. The etching method according to claim 1, wherein said auxiliary gas is a member selected from the group consisting of C$_2$H$_4$, C$_3$H$_6$, C$_2$H$_2$, C$_3$H$_4$, toluene, xylene and phenol.

15. The etching method according to claim 1, wherein said auxiliary gas is a member selected from the group consisting of air, N$_2$, O$_2$, O$_3$, H$_2$O, H$_2$O$_2$, and H$_2$.

16. The etching method according to claim 1, wherein inert gas is used as auxiliary gas.

17. The etching method according to claim 1, wherein said auxiliary gas is a member selected from the group consisting of He, Ne, Ar, Kr, Xe and Rn.

18. The etching method according to claim 1, wherein said auxiliary gas is a member selected from the group consisting of AsH$_3$, R-AsH$_2$, R$_2$-AsH and R$_3$-As, R=alkyl.

19. The etching method according to claim 1, wherein Boron hydride is used as auxiliary gas.

20. The etching method according to claim 1, wherein silane is used as auxiliary gas.

21. The etching method according to claim 1, wherein said auxiliary gas is a member selected from the group consisting of SiH$_4$, Si$_2$H$_6$, Si$_3$H$_8$ and Si$_4$H$_{10}$.

22. The etching method according to claim 1, wherein said auxiliary gas is a member selected from the group consisting of alcohols and polyols.

23. The etching method according to claim 1, wherein said auxiliary gas is a member selected from the group consisting of ethers and thioethers.

24. The etching method according to claim 1, wherein ketone is used as auxiliary gas.

25. The etching method according to claim 1, wherein said auxiliary gas is a member selected from the group consisting of acetone, dimethyl ketone, methyl ethyl ketone (MEK), pinacoline, unsaturated mesythyloxide, acetophenone, benzophenone, diketones, quinones, cyclic ketones such as cyclohexanone, hydroxylketone, ketonic acid and quinols.

26. The etching method according to claim 1, wherein said auxiliary gas is a member selected from the group consisting of carbonyl sulfide (COS) and phosgene (COCl$_2$).

27. The etching method according to claim 1, wherein said auxiliary gas is a member selected from the group consisting of formic acid (HCOOH) and acetic acid (CH$_3$COOH).

28. The etching method according to claim 1, wherein thionyl bromide (SOBr$_2$) is used as auxiliary gas.

29. The etching method according to claim 1, wherein phospholyl such as POCl$_3$ is used as auxiliary gas.

30. The etching method according to claim 1, wherein phosphorous hidride is used as auxiliary gas.

31. The etching method according to claim 1, wherein said auxiliary gas is a member selected from the group consisting of phosphine (PH$_3$) and alkyl phosphine (R-PH$_2$).

32. The etching method according to claim 1, wherein said auxiliary gas is a member selected from the group consisting of sulfuric and nitric acids.

33. The etching method according to claim 1, wherein ammonia is used as auxiliary gas.

34. The etching method according to claim 1, wherein said auxiliary gas is a member selected from the group consisting of N$_2$O, NO, NO$_2$, NO$_3$, N$_2$O$_3$, N$_2$O$_4$, N$_2$O$_5$ and N$_2$O$_6$.

35. The etching method according to claim 1, wherein said auxiliary gas is a member selected from the group consisting of CS$_2$, H$_2$S, N$_2$S$_2$, N$_4$S$_4$, As$_4$S$_4$, As$_2$S$_3$, P$_4$S$_7$ and P$_2$S$_5$.

36. The etching method according to claim 1, wherein said auxiliary gas is a member selected from the group consisting of SO, SO$_2$, SO$_3$, S$_2$O, S$_2$O$_3$, S$_2$O$_7$ and SO$_4$.

37. The etching method according to claim 1, wherein phosphoric acid is used as auxiliary gas.

38. The etching method according to claim 1, wherein said auxiliary gas is a member selected from the group consisting of OF$_2$, O$_2$F$_2$ and O$_3$F$_2$.

39. The etching method according to claim 1, wherein said auxiliary gas is a member selected from the group consisting of Cl$_2$O, ClO, ClO$_2$, ClO$_3$, Cl$_2$O$_6$, Cl$_2$O$_7$ and ClO$_4$.

40. The etching method according to claim 1, wherein said auxiliary gas is a member selected from the group consisting of Br$_2$O, BrO$_2$, BrO$_3$, Br$_3$O$_8$ and Br$_3$O$_7$.

41. The etching method according to claim 1, wherein said auxiliary gas is a member selected from the group consisting of As$_2$O$_3$, As$_2$O$_5$ and As$_2$O$_4$.

42. The etching method according to claim 1, wherein cyanogen fluoride is used as auxiliary gas.

43. The etching method according to claim 1, wherein said film is formed of at least one of thermal SiO$_2$, CVD-SiO$_2$, PSG, BPSG, BSG, AsSG, SiO$_2$-SixNy-SiO$_2$ (ONO), PbO.SiO$_2$, PbO.Al$_2$O$_3$.SiO$_2$, PbO.B$_2$O$_3$.SiO$_2$, SiOxNy, SiON, Ta$_2$O$_5$ and TiO$_2$.

44. The etching method according to claim 1, further comprising the steps of:

providing means for reserving the auxiliary gas; and enhancing the response of the pressure of the supplied gas to the chamber by making an internal circulation of the auxiliary gas in gas reserving means.

45. The etching method according to claim 1, wherein said auxiliary gas is selected from the group consisting of saturated hydrocarbons, unsaturated hydrocarbons, saturated cyclic hydrocarbons, unsaturated cyclic hydrocarbons, aromatic compounds, air, $N_2$, $O_2$, $O_3$, $H_2O$, $H_2O_2$, $H_2$, $CO$, $CO_2$, $ASH_3$, $R-AsH_2$, $R_2-AsH$, $R_3-As$, R-alkyl group boron hydrides, silanes, alcohols, polyols, ethers, thioethers, ketones, carbonyl sulfide, phosgene, formic acid, acetic acid, thionyl bromide, phospholyl, phosphorous hydrides, sulfuric acid, nitric acid, ammonia, $N_2O$, $NO$, $NO_2$, $NO_3$, $N_2O_3$, $N_2O_4$, $N_2O_5$, $N_2O_6$, $CS_2$, $H_2S$, $N_2S_2$, $N_4S_4$, $As_4S_4$, $As_2S_3$, $P_4S_7$, $P_2S_5$, $SO$, $SO_2$, $SO_3$, $S_2O$, $S_2O_3$, $S_2O_7$, $SO_4$, phosphoric acids, $OF_2$, $O_2F_2$, $O_3F_2$, $Cl_2O$, $ClO$, $ClO_2$, $Cl_3$, $Cl_2O_6$, $Cl_2O_7$, $ClO_4$, $Br_2O$, $BrO_2$, $BrO_3$, $Br_3O_8$, $Br_3O_7$, $As_2O_3$, $As_2O_5$, $As_2O_4$ and cyanogen fluoride.

46. A method of etching a film formed on a surface of a semiconductor wafer, comprising:

providing a first gas source and a second gas source, which both communicate with a chamber, and a valve arranged on a passageway communicating said first gas source and said second gas source;

holding a wafer on a lower electrode in the chamber by an electrostatic chuck such that the wafer faces an upper electrode;

exhausting the chamber to reduce an inner pressure of the chamber;

forming an electric field under the reduced pressure between the wafer and the upper electrode while supplying a process gas from said first gas source, through the upper electrode toward the wafer to form a gas plasma of the process gas; and simultaneously introducing an auxiliary gas differing in composition from the process gas, from said second gas source by closing said valve, or from both said first and second gas sources by opening said valve, into a micro-clearance between the wafer and the lower electrode and allowing said auxiliary gas to leak into the chamber through said micro-clearance, while the gas plasma of the process gas is acting on the wafer, thereby allowing an etching reaction performed by the gas plasma of the process gas in a peripheral portion of the wafer to be controlled by the auxiliary gas;

wherein 1) the process gas comprises a gas not present in the auxiliary gas or the auxiliary gas comprises a gas not present in the process gas or 2) the auxiliary gas comprises a gas not present in the process gas and the process gas comprises a gas not present in the auxiliary gas.

47. The etching method according to claim 46, wherein a voltage applied to said electrostatic chuck is controlled to fall within a range of between 1 kV and 3 kV.

* * * * *